(12) United States Patent
Cho et al.

(10) Patent No.: US 11,949,045 B2
(45) Date of Patent: Apr. 2, 2024

(54) LIGHT EMITTING ELEMENT STRUCTURE AND METHOD OF FABRICATING A LIGHT EMITTING ELEMENT

(71) Applicant: Samsung Display Co., Ltd., Yongin-si (KR)

(72) Inventors: Hyun Min Cho, Seoul (KR); Jung Hong Min, Pyeongtaek-si (KR); Dae Hyun Kim, Hwaseong-si (KR); Dong Uk Kim, Hwaseong-si (KR); Jae Hoon Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 421 days.

(21) Appl. No.: 17/290,682

(22) PCT Filed: May 27, 2019

(86) PCT No.: PCT/KR2019/006323
§ 371 (c)(1),
(2) Date: Apr. 30, 2021

(87) PCT Pub. No.: WO2020/091171
PCT Pub. Date: May 7, 2020

(65) Prior Publication Data
US 2022/0013693 A1  Jan. 13, 2022

(30) Foreign Application Priority Data
Oct. 30, 2018 (KR) .................. 10-2018-0131072

(51) Int. Cl.
*H01L 33/44* (2010.01)
*H01L 27/15* (2006.01)
(Continued)

(52) U.S. Cl.
CPC ............ *H01L 33/44* (2013.01); *H01L 27/156* (2013.01); *H01L 33/0093* (2020.05); *H01L 33/24* (2013.01); *H01L 2933/0025* (2013.01)

(58) Field of Classification Search
CPC ... H01L 33/44; H01L 27/156; H01L 33/0093; H01L 33/24; H01L 2933/0025;
(Continued)

(56) References Cited

U.S. PATENT DOCUMENTS 9,570,653 B2  2/2017  Fang et al.
10,325,893 B2  6/2019  Chong et al.
(Continued)

FOREIGN PATENT DOCUMENTS

JP          4104154 B2 *  6/2008  ............. C09K 13/02
KR    10-2009-0074091 A     7/2009
(Continued)

OTHER PUBLICATIONS

International Search Report for corresponding Application No. PCT/KR2019/006323 dated Oct. 18, 2019, 4 pps.

*Primary Examiner* — J. E. Schoenholtz
(74) *Attorney, Agent, or Firm* — Lewis Roca Rothgerber Christie LLP

(57) ABSTRACT

Provided are a light-emitting diode structure and a light-emitting diode manufacturing method. The light-emitting diode manufacturing method comprises the operations of: preparing a lower substrate, which includes a substrate and a separation layer formed on the substrate, and preparing at least one semiconductor rod, which is formed on the separation layer, forming a rod structure, which includes a rod protecting layer formed on the separation layer to surround the at least one semiconductor rod and an auxiliary layer formed on at least part of the rod protecting layer and separating the rod (Continued)

structure from the lower substrate by removing the separation layer, and separating the at least one semiconductor rod from the rod structure.

19 Claims, 21 Drawing Sheets

(51) Int. Cl.
*H01L 33/00* (2010.01)
*H01L 33/24* (2010.01)

(58) Field of Classification Search
CPC . H01L 33/007; H01L 2933/005; H01L 33/56; H01L 33/18; H01L 33/20; H01L 33/38; H01L 25/0753; H01L 2933/0016; H01L 33/0095

See application file for complete search history.

(56) References Cited

U.S. PATENT DOCUMENTS

| | | |
|---|---|---|
| 2009/0253249 A1 | 10/2009 | Taniguchi et al. |
| 2010/0197054 A1 | 8/2010 | Yonehara |
| 2015/0255668 A1 | 9/2015 | Pan et al. |
| 2017/0069491 A1 | 3/2017 | Cheng et al. |
| 2017/0076986 A1 | 3/2017 | Forrest et al. |
| 2017/0307939 A1* | 10/2017 | Banin .................... G02F 1/137 |
| 2017/0317228 A1 | 11/2017 | Sung |

FOREIGN PATENT DOCUMENTS

| | | |
|---|---|---|
| KR | 10-1140096 B1 | 4/2012 |
| KR | 10-2012-0122160 A | 7/2012 |
| KR | 10-2012-0122159 A | 11/2012 |
| KR | 10-1373398 B1 | 4/2014 |
| KR | 10-2015-0094220 A | 8/2015 |
| WO | WO 2012/148231 A2 | 11/2012 |

* cited by examiner

LIGHT EMITTING ELEMENT STRUCTURE AND METHOD OF FABRICATING A LIGHT EMITTING ELEMENT

CROSS-REFERENCE TO RELATED APPLICATION

This application is a U.S. National Phase Patent Application of International Application Number PCT/KR2019/006323, filed on May 27, 2019, which claims priority to Korean Patent Application No. 10-2018-0131072, filed on Oct. 30, 2018, the entire contents of all of which are incorporated herein by reference.

TECHNICAL FIELD

The present disclosure relates to a method of fabricating a light-emitting element, and for example, to a light-emitting element structure including an organic passivation film capable of preventing a light-emitting element from being damaged by an etchant and a method of fabricating a light-emitting element.

BACKGROUND ART

Display devices are becoming more important with developments in multimedia technology. Accordingly, various display devices such as an organic light-emitting diode (OLED) display device, a liquid crystal display (LCD) device, and the like have been used.

A typical display device includes a display panel such as an OLED display panel or an LCD panel. A light-emitting display panel may include light-emitting elements such as, for example, light-emitting diodes (LEDs), and LEDs may be classified into OLEDs using an organic material as a fluorescent material and inorganic LEDs (ILEDs) using an inorganic material as a fluorescent material.

OLEDs, which are LEDs using an organic material as a fluorescent material, are simple to fabricate, and OLED display devices are desirably flexible. However, OLEDs are susceptible to a high-temperature environment and have a relatively low efficiency for blue light.

On the contrary, ILEDs, which are LEDs using an inorganic semiconductor as a fluorescent material, have durability even in a high-temperature environment and have a higher efficiency than OLEDs for blue light. Also, a transfer method using dielectrophoresis (DEP) has been developed as a manufacturing method of ILEDs, which has long been pointed out as a limitation of ILEDs, and research has been continued on ILEDs with more excellent durability and efficiency than OLEDs.

DISCLOSURE

Technical Problems

ILEDs may be obtained by growing semiconductor layers doped with an n- or p-type dopant and an inorganic fluorescent material layer on a substrate to form rods of a particular shape and separating the rods. However, in the case of using a chemical lift-off (CLO) method to separate the rods, the outer circumferential surfaces of the rods and electrodes at both ends of each of the rods may be damaged by an etchant for removing a separation layer To address the aforementioned problems, embodiments of the present disclosure provide a method of fabricating a light-emitting element, which is capable of minimizing damage to the outer circumferential surface or electrodes of each semiconductor rod.

Embodiments of the present disclosure also provide a light-emitting element structure including a plurality of light-emitting elements and a rod protecting layer, which protects the light-emitting elements not to be in contact with the outside.

It should be noted that objects of the present disclosure are not limited to the above-mentioned object; and other objects of the present disclosure will be apparent to those skilled in the art from the following descriptions.

Technical Solutions

According to some embodiments of the present disclosure, a method of fabricating a light-emitting element, comprising: preparing a lower substrate, which includes a substrate and a separation layer formed on the substrate, and preparing at least one semiconductor rod, which is formed on the separation layer, forming a rod structure, which includes a rod protecting layer formed on the separation layer to surround the at least one semiconductor rod and an auxiliary layer formed on at least part of the rod protecting layer and separating the rod structure from the lower substrate by removing the separation layer, and separating the at least one semiconductor rod from the rod structure.

In the separating the rod structure, the separation layer may be etched away by an etchant for separation, and the rod protecting layer may do not react with the etchant for separation.

The etchant for separation may include a material containing fluorine (F), and the rod protecting layer may include an organic material that is insoluble in the etchant for separation.

The forming the rod structure, may comprise forming the rod protecting layer by coating the at least one semiconductor rod with the organic material.

The organic material of the rod protecting layer may include at least one of polymethyl methacrylate (PMMA), photoresist (PR), and poly-(3,4-ethylenedioxy thiophene) polystyrene sulfonate (PEDOT:PSS).

The separating the at least one semiconductor rod, may comprise removing the auxiliary layer from the rod protecting layer, dissolving the organic material of the rod protecting layer in a solvent, and removing the organic material dissolved in the solvent.

The removing the organic material dissolved in the solvent, may comprise thermally treating, and thereby evaporating, the organic material.

In the preparing the at least one semiconductor rod, uneven patterns, including one or more grooves, which are parts of the separation layer that are depressed, and protrusions, which are formed due to the grooves being spaced apart from one another, are formed.

The forming the rod structure, may comprise forming the rod protecting layer to surround the protrusions of the separation layer and be in contact with top surfaces of the grooves.

The at least one semiconductor rod may be arranged in the rod protecting layer such that a first end portion of the at least one semiconductor rod faces a first surface of the rod protecting layer and a second end portion of the at least one semiconductor rod that is opposite to the first end portion of the at least one semiconductor rod faces a second surface of the rod protecting layer that is opposite to the first surface of the rod protecting layer.

The second end portion of the at least one semiconductor rod may be in contact with the protrusions of the separation layer.

The at least one semiconductor rod may be arranged in a direction perpendicular to the first surface of the rod protecting layer.

The at least one semiconductor rod may include a semiconductor crystal, which includes a first conductivity semiconductor, an active layer, and a second conductivity semiconductor having a different polarity from the first conductivity semiconductor, and an insulating film, which surrounds an outer circumferential surface of the semiconductor crystal.

The auxiliary layer may be formed on the first surface faced by the first end portion of the at least one semiconductor rod.

According to some embodiments of the present disclosure, a light-emitting element structure comprising: an organic protective film including an organic material that is insoluble in an etchant containing fluorine (F), at least one semiconductor rod disposed in the organic protective film and arranged to be spaced apart in a direction parallel to a first surface of the organic protective film; and an auxiliary layer formed on at least part of the organic protective film.

The organic material of the organic protective film may include at least one of polymethyl methacrylate (PMMA), photoresist (PR), and poly-(3,4-ethylenedioxy thiophene) polystyrene sulfonate (PEDOT:PSS).

The first surface of the organic protective film may be substantially flat, and a second surface of the organic protective film that is opposite to the first surface of the organic protective film and on which the auxiliary layer is not formed may include at least one depression, which is formed due to an area that overlaps with the at least one semiconductor rod being depressed.

A long axis of the at least one semiconductor rod may extend in a direction perpendicular to the first surface of the organic protective film.

The at least one semiconductor rod may be aligned such that first and second end portions of the at least one semiconductor rod face the first and second surfaces, respectively, of the organic protective film, and the second end portion of the at least one semiconductor rod may be in part in contact with the at least one depression.

The at least one semiconductor rod may include a semiconductor crystal, which includes a first conductivity semiconductor, a second conductivity semiconductor having a different polarity from the first conductivity semiconductor, and an active layer disposed between the first and second conductivity semiconductors, and the semiconductor crystal may have a structure in which the first conductivity semiconductor, the active layer, and the second conductivity semiconductor are stacked in the direction in which the long axis of the at least one semiconductor rod extends.

The above and other features and advantages of the present disclosure will become more apparent by describing in detail embodiments thereof with reference to the attached drawings.

Advantageous Effects

According to embodiments of the present disclosure, since a method of fabricating a light-emitting element, forming a rod structure including semiconductor rods, is provided, the semiconductor rods can be prevented from being damaged by an etchant for a separation layer when separating the semiconductor rods from a lower substrate. The rod structure including the semiconductor rods include a rod protecting layer, which does not react with the etchant, and an auxiliary layer, which is formed on the rod protecting layer, and can thus easily store and transport the semiconductor rods.

Therefore, light-emitting elements can be formed with smooth outer surfaces without damaging electrode layers or insulating films, and any contact or emission failure in a display device can be minimized.

The effects of the present disclosure are not limited to the above-described effects, and other unmentioned effects will be clearly understood to those skilled in the art from the description of claims.

BEST MODES FOR CARRYING OUT THE INVENTION

The present disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will filly convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Figure 1:
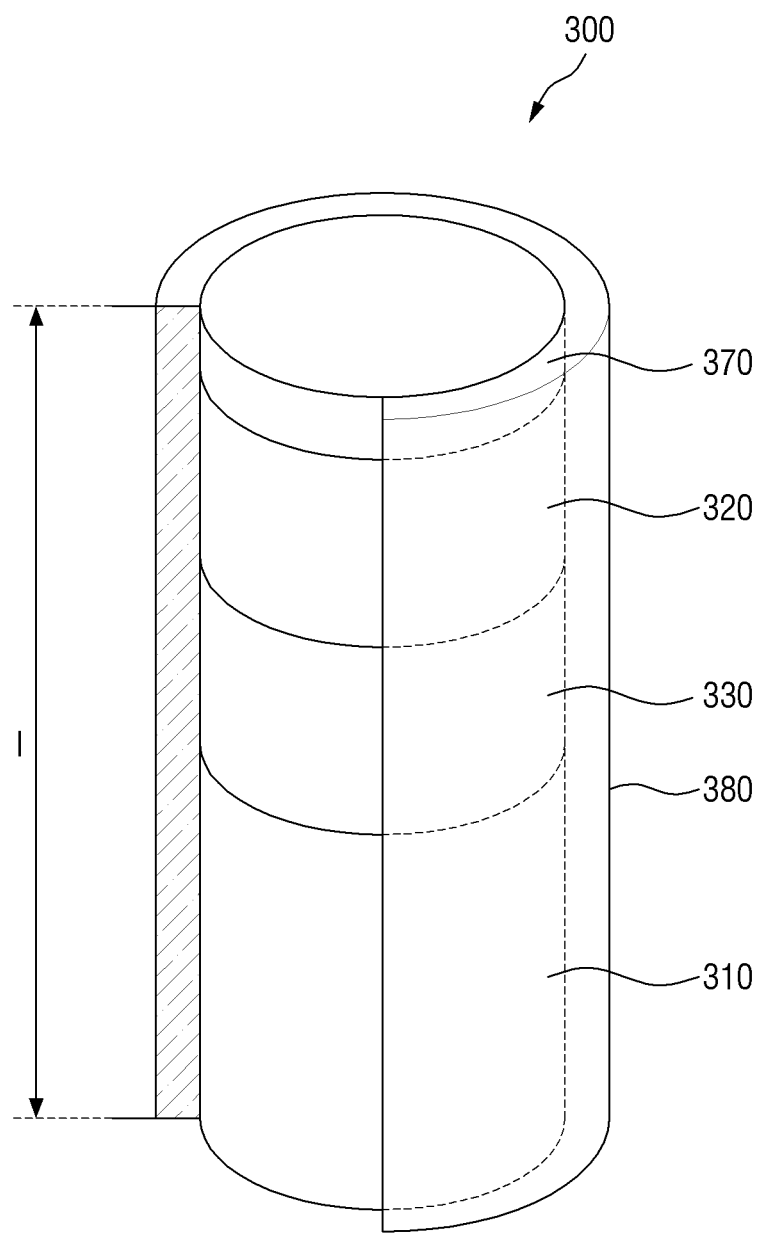
FIG. 1 is a schematic view of a light-emitting element according to some embodiments of the present disclosure.

Hereinafter, embodiments of the present disclosure will be described in detail with reference to the accompanying drawings. FIG. 1 is a schematic view of a light-emitting element according to some embodiments of the present disclosure.

A light-emitting element 300 may include semiconductor crystals doped with impurities of an arbitrary conductivity type (e.g., a p type or an n type). The semiconductor crystals may receive electrical signals applied from an external power source and may emit light of a particular wavelength range. A display device (10 of FIG. 20) that will be described later may include a plurality of light-emitting elements 300 in each pixel (PX of FIG. 20) thereof and may display light emitted by the plurality of light-emitting elements 300.

The light-emitting element 300 may be a light-emitting diode (LED), for example, an inorganic LED (ILED) having a micro- or nano-meter size and formed of an inorganic material. In a case where the light-emitting element 300 is an ILED, the light-emitting element 300 may be aligned between two opposing electrodes by placing a light-emitting material having an inorganic crystal structure between the two opposing electrodes and forming an electric field in the light-emitting material in a particular direction. The light-emitting element 300, which has a fine size, may be aligned on electrodes of the display device 10 by forming an electric field. Once aligned on the electrodes of the display device 10, the light-emitting element 300 may receive electrical signals and may emit light of a particular wavelength range.

Referring to FIG. 1, the light-emitting element 300 may include a plurality of conductivity-type semiconductors/conductivity semiconductors (310 and 320), an element active layer 330, an electrode material layer 370, and an insulating film 380. The conductivity semiconductors (310 and 320) may transmit electrical signals applied to the light-emitting element 300 to the element active layer 330, and the element active layer 330 may emit light of a particular wavelength range.

Figure 3:
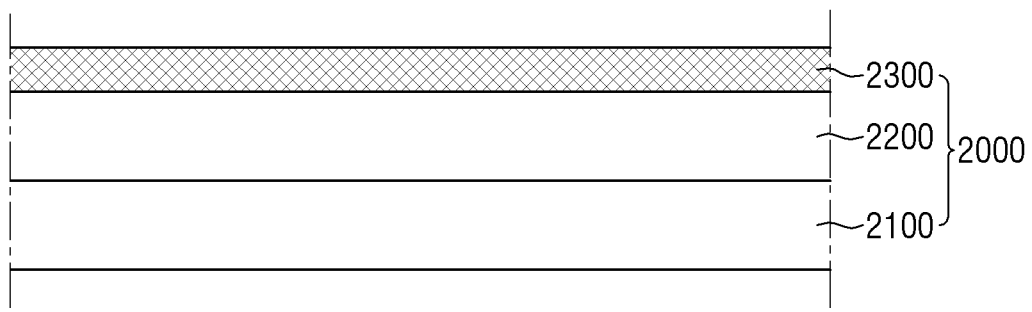
FIGS. 3 through 9 are schematic views illustrating the method of fabricating a light-emitting element according to some embodiments of the present disclosure.

For example, the light-emitting element 300 may include a first conductivity semiconductor 310, a second conductivity semiconductor 320, the element active layer 330, which is disposed between the first and second conductivity semiconductors 310 and 320, the electrode material layer 370, which is disposed on the second conductivity semiconductor 320, and the insulating film 380, which is disposed to surround outer circumferential surfaces of the first conductivity semiconductor 310, the second conductivity semiconductor 320, the element active layer 330, and the electrode material layer 370. The insulating film 380 may be formed to be in contact with the first conductivity semiconductor 310, the second conductivity semiconductor 320, the element active layer 330, and the electrode material layer 370 and to surround the outer circumferential surfaces of the first conductivity semiconductor 310, the second conductivity semiconductor 320, the element active layer 330, and the electrode material layer 370. The light-emitting element 300 of FIG. 3 is illustrated as having a structure in which the first conductivity semiconductor 310, the element active layer 330, the second conductivity semiconductor 320, and the electrode material layer 370 are sequentially formed in the length direction of the light-emitting element 300, but the present disclosure is not limited thereto. Alternatively, the electrode material layer 370 may not be provided. In some embodiments, the electrode material layer 370 may be disposed on at least one side of each of the first and second conductivity semiconductors 310 and 320. The light-emitting element 300 of FIG. 1 will hereinafter be described as an example, and the following description of the light-emitting element 300 may be directly applicable to light-emitting elements 300 having different structures from the light-emitting element 300 of FIG. 1.

The first conductivity semiconductor 310 may be an n-type semiconductor layer. For example, in a case where the light-emitting element 300 emits light of a blue wavelength range, the first conductivity semiconductor 310 may be a semiconductor material having the chemical formula $In_xAl_yGa_{1-x-y}N$ (where $0 \le x \le 1$, $0 \le y \le 1$, and $0 \le x+y \le 1$). For example, the first conductivity semiconductor 310 may include one of InAlGaN, GaN, AlGaN, InGaN, AlN, and InN that are doped with an n-type dopant. The first conductivity semiconductor 310 may be doped with a first conductivity dopant. For example, the first conductivity dopant may be Si, Ge, Sn, or the like. The first conductivity semiconductor 310 may have a length of 1.5 µm to 5 µm, but the present disclosure is not limited thereto.

The second conductivity semiconductor 320 may be a p-type semiconductor layer. For example, in a case where the light-emitting element 300 emits light of a blue wavelength range, the second conductivity semiconductor 320 may be a semiconductor material having the chemical formula $In_xAl_yGa_{1-x-y}N$ (where $0 \le x \le 1$, $0 \le y \le 1$, and $0 \le x+y \le 1$). For example, the second conductivity semiconductor 320 may include one of InAlGaN, GaN, AlGaN, InGaN, AlN, and InN that are doped with a p-type dopant. The second conductivity semiconductor 320 may be doped with a second conductivity dopant. For example, the second conductivity dopant may be Mg, Zn, Ca, Se, Ba, or the like. The second conductivity semiconductor 320 may have a length of 0.08 µm to 0.25 µm, but the present disclosure is not limited thereto.

Meanwhile, the first and second conductivity semiconductors 310 and 320 are illustrated as being single-layer films, but the present disclosure is not limited thereto. Alternatively, each of the first and second conductivity semiconductors 310 and 320 may include more than one layer depending on the material of the element active layer 330 that will be described later.

The element active layer 330 may be disposed between the first and second conductivity semiconductors 310 and 320 and may include a material having a single- or multi-quantum well structure. In a case where the element active layer 330 includes a material having a multi-quantum well structure, the element active layer 330 may have a structure in which multiple quantum layers and multiple well layers are alternately stacked. The element active layer 330 may emit light by combining electron-hole pairs in accordance with electrical signals applied thereto via the first and second conductivity semiconductors 310 and 320. For example, in a case where the element active layer 330 emits light of a blue wavelength range, the quantum layers may include a material such as AlGaN or AlInGaN. For example, in a case where the element active layer 330 has a multi-quantum well structure in which multiple quantum layers and multiple well layers are alternately stacked, the quantum layers may include a material such as AlGaN or AlInGaN, and the well layers may include a material such as GaN or AlGaN.

However, the present disclosure is not limited to this. Alternatively, the element active layer 330 may have a structure in which a semiconductor material having a large band gap energy and a semiconductor material having a small band gap energy are alternately stacked or may include group-III or group-V semiconductor materials depending on the wavelength of light to be emitted. The type of light emitted by the element active layer 330 is not particularly limited. The element active layer 330 may emit light of a red or green wavelength range, instead of light of a blue wavelength range. The element active layer 330 may have a length of 0.05 µm to 0.25 µm, but the present disclosure is not limited thereto.

Light may be emitted from the element active layer 330 not only through the outer surface, in the length direction, of the light-emitting element 300, but also through the side surface of the light-emitting element 300. The directivity of light emitted from the element active layer 330 is not particularly limited.

The electrode material layer 370 may be an ohmic contact electrode, but the present disclosure is not limited thereto. Alternatively, the electrode material layer 370 may be a Schottky contact electrode. The electrode material layer 370 may include a conductive metal. For example, the electrode material layer 370 may include at least one of aluminum (Al), titanium (Ti), indium (In), gold (Au), silver (Ag), indium tin oxide (ITO), indium zinc oxide (IZO), and indium tin zinc oxide (ITZO). The electrode material layer 370 may include a single material or multiple different materials, but the present disclosure is not limited thereto.

The insulating film 380 may be formed on the outside of the first conductivity semiconductor 310, the second conductivity semiconductor 320, the element active layer 330, and the electrode material layer 370 and may protect the first conductivity semiconductor 310, the second conductivity semiconductor 320, the element active layer 330, and the electrode material layer 370. For example, the insulating film 380 may be formed to surround the side surfaces of the first conductivity semiconductor 310, the second conductivity semiconductor 320, the element active layer 330, and the electrode material layer 370, but not on both end portions, in the length direction, of the light-emitting element 300, for example, on end portions of the light-emitting element 300 where the first conductivity semiconductor 310 and the electrode material layer 370 are disposed, but the present disclosure is not limited thereto.

The insulating film 380 may include an insulating material such as, for example, silicon oxide (SiOx), silicon nitride (SiNx), silicon oxynitride (SiOxNy), or aluminum nitride (AlN), or aluminum oxide (Al2O3). Accordingly, the insulating film 380 can prevent the element active layer 330 from being short-circuited when the light-emitting element 300 is placed in direct contact with electrodes to which electrical signals are applied. Also, since the insulating film 380 protects the outer circumferential surface of the light-emitting element 300 including the element active layer 330, any degradation in the emission efficiency of the light-emitting element 300 can be prevented.

The insulating film 380 is illustrated as extending in the length direction of the light-emitting element 300 to cover the light-emitting element 300 from the first conductivity semiconductor 310 to the electrode material layer 370, but the present disclosure is not limited thereto. The insulating film 380 might cover only the first conductivity semiconductor 310, the element active layer 330, and the second conductivity semiconductor 320 or might cover only part of the outer surface of the electrode material layer 370 to expose part of the outer surface of the electrode material layer 370.

The insulating film 380 may have a thickness of 0.5 µm to 1.5 µm, but the present disclosure is not limited thereto.

Also, in some embodiments, the outer surface of the insulating film 380 may be treated. The light-emitting element 300 may be aligned between a plurality of electrodes of the display device (illustrated in FIG. 20) that will be described later and may thus receive electrical signals from the electrodes and emit light. The light-emitting element 300 may be sprayed onto the electrodes in a state of being dispersed in a predetermined ink. Here, the surface of the insulating film 380 may be hydrophobically or hydrophilically treated to keep the light-emitting element 300 properly dispersed in the predetermined ink without agglomerating with other neighboring light-emitting elements 300.

The light-emitting element 300 may extend in one direction. The light-emitting element 300 may have a nanorod, nanowire, or nanotube shape. For example, the light-emitting element 300 may have a cylindrical or rod shape. However, the shape of the light-emitting element 300 is not particularly limited, and the light-emitting element 300 may have various other shapes such as a cube shape or a rectangular or hexagonal column shape.

The light-emitting element 300 may have a length l of 1 µm to 10 µm or 2 µm to 5 µm, for example, about 4 µm. Also, the light-emitting element 300 may have a diameter of 300 nm to 700 nm, and different light-emitting elements 300 included in the display device 10 may have different diameters depending on the composition of their respective element active layers 330. For example, the light-emitting element 300 may have a diameter of about 500 nm.

Meanwhile, the light-emitting element 300 may be formed on a substrate by epitaxial growth. A seed crystal layer may be formed on the substrate to form semiconductor layers, and desired semiconductor materials are deposited and grown. However, when the light-emitting element 300, which includes semiconductor crystals grown on the substrate, is separated from the substrate, the separation surface needs to be manufactured to have a smooth shape. As will be described later, both end portions of the light-emitting element 300 may be in contact with the electrodes of the display device 10 and may thus receive electrical signals. To form the light-emitting element 300 with smooth end portions, the light-emitting element 300 may be fabricated using a chemical lift-off (CLO) method.

In the case of using the CLO method, a separation layer is formed on a substrate, and semiconductor crystals are deposited. However, an etchant used to remove the separation layer may react with the material of the light-emitting element 300. That is, when the light-emitting element 300 is separated from the substrate by removing the separation layer with the etchant, the insulating film 380 or the electrode material layer 370 of the light-emitting element 300 may be damaged by the etchant.

However, a method of fabricating the light-emitting element 300 according to some embodiments of the present disclosure can prevent the light-emitting element 300 from being damaged by the etchant, and as a result, the light-emitting element 300 can be fabricated to have a smooth outer surface and smooth end portions. Accordingly, any contact or emission failure of the light-emitting element 300, which is aligned on the electrodes of the display device 10, can be minimized.

Figure 2:
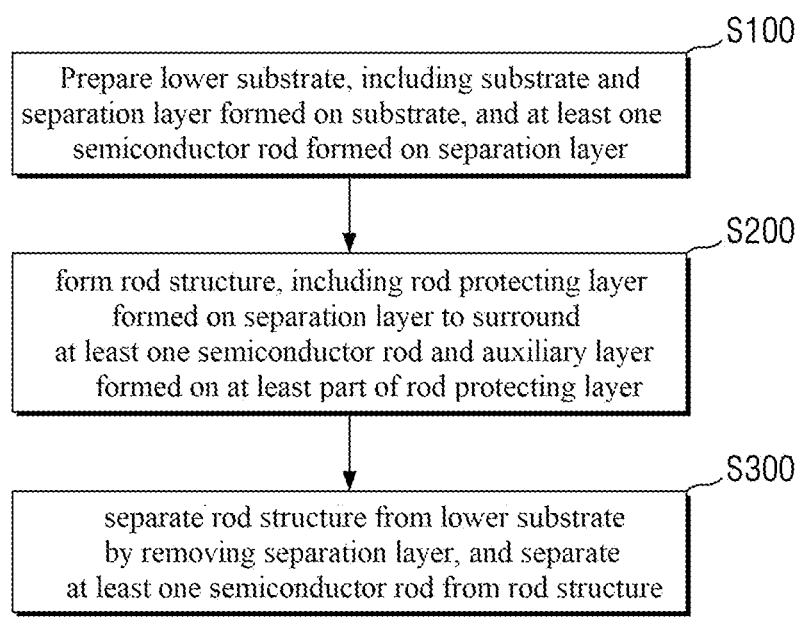
FIG. 2 is a flowchart illustrating a method of fabricating a light-emitting element according to some embodiments of the present disclosure.

FIG. 2 is a flowchart illustrating a method of fabricating a light-emitting element according to some embodiments of the present disclosure.

Referring to FIG. 2, the method of fabricating a light-emitting element 300 according to some embodiments of the present disclosure may include: preparing a lower substrate 2000, which includes a base substrate 2100 and a separation layer 2300 formed on the base substrate 2100, and one or more semiconductor rods "ROD", which are formed on the separation layer 2300 (S100); forming a rod structure 1000, which includes a rod protecting layer 1100 formed on the separation layer 2300 and surrounding the semiconductor rods "ROD", and an auxiliary layer 1200 formed on the rod protecting layer 1100 (S200); and separating the rod structure 1000 from the lower substrate 2000 by removing the separation layer 2300, and separating the semiconductor rods "ROD" from the rod structure 1000.

The method of fabricating a light-emitting element 300 according to some embodiments of the present disclosure includes forming the rod structure 1000, which includes the rod protecting layer 1100 that does not react with an etchant for removing the separation layer 2300. Accordingly, when the semiconductor rods "ROD", i.e., light-emitting elements 300, are being separated, some of the material of the light-emitting elements 300 can be prevented from being damaged by reacting with the etchant. The method of FIG. 2 will hereinafter be described in detail with reference to other drawings.

FIGS. 3 through 9 are schematic views illustrating the method of fabricating a light-emitting element according to some embodiments of the present disclosure.

First, referring to FIG. 3, a lower substrate 2000, which includes a base substrate 2100, a buffer material layer 2200 formed on the base substrate 2100, and a separation layer 2300 formed on the buffer material layer 2200, is prepared. As illustrated in FIG. 3, the lower substrate 2000 may have a structure in which the base substrate 2100, the buffer material layer 2200, and the separation layer 2300 are sequentially stacked.

The base substrate 2100 may include a transparent substrate such as a sapphire (Al2O3) substrate or glass, but the present disclosure is not limited thereto. Alternatively, the base substrate 2100 may be formed as a conductive substrate of GaN, SiC, ZnO, Si, GaP, GaAs, or the like. The base substrate 2100 will hereinafter be described as being, for example, a sapphire (Al2O3) substrate. The thickness of the base substrate 2100 is not particularly limited, for example, the base substrate 2100 may have a thickness of 400 μm to 1500 μm.

Thereafter, a plurality of conductivity semiconductor layers are formed on the base substrate 2100. The conductivity semiconductor layers may be grown via epitaxial growth by forming seed crystals and depositing a crystal material on the seed crystals. Here, the conductivity semiconductor layers may be formed by electron beam deposition, physical vapor deposition (PVD), chemical vapor deposition (CVD), plasma laser deposition (PLD), dual-type thermal evaporation, sputtering, metal-organic chemical vapor deposition (MOCVD), or the like, for example, MOCVD, but the present disclosure is not limited thereto.

A precursor material for forming the conductivity semiconductor layers is not particularly limited as long as it is within the range of what is generally selected as a material for forming a target material. For example, the precursor material may be a metal precursor including an alkyl group such as a methyl group or an ethyl group. For example, the precursor material may be a compound such as trimethyl gallium (Ga(CH3)3), trimethyl aluminum (Al(CH3)3), or triethyl phosphate ((C2H5)3PO4), but the present disclosure is not limited thereto. Descriptions of how and under what conditions to form the conductivity semiconductor layers will be omitted, and instead, the order and stack structure in which to form the light-emitting elements 300 will be hereinafter described in detail.

The buffer material layer 2200 is formed on the base substrate 2100. The buffer material layer 2200 is illustrated as being deposited as a single layer, but the present disclosure is not limited thereto. Alternatively, a plurality of buffer material layers 2200 may be formed. The buffer material layer 2200 may be disposed to reduce the difference in lattice constant between a first conductivity semiconductor layer 3100 and the base substrate 2100. In subsequent processes, the buffer material layer 2200 may reduce the difference in lattice constant between the first conductivity semiconductor layer 3100 and the base substrate 2100 or provide seed crystals such that the crystals of the first conductivity semiconductor layer 3100 can be smoothly grown.

For example, the buffer material layer 2200 may include an undoped semiconductor, i.e., substantially the same material as the first conductivity semiconductor layer 3100, and may include a material not doped with an n- or p-type dopant. For example, the buffer material layer 2200 may include at least one of InAlGaN, GaN, AlGaN, InGaN, AlN, and InN that are undoped, but the present disclosure is not limited thereto.

Meanwhile, a plurality of layers may be formed on the buffer material layer 2200, and the separation layer 2300 may be disposed on the plurality of layers. The buffer material layer 2200 may not be provided depending on the type of the base substrate 2100. An example in which a buffer material layer 2200 including an undoped semiconductor material is formed on the base substrate 2100 will hereinafter be described.

The first conductivity semiconductor layer 3100 is formed on the separation layer 2300. The separation layer 2300 may include a material capable of smoothly growing the crystals of the first conductivity semiconductor layer 3100. The separation layer 2300 may include at least one of an insulating material and a conductive material. For example, the separation layer 2300 may include silicon oxide (SiOx), silicon nitride (SiNx), or silicon oxynitride (SiOxNy) as an insulating material and may include ITO, IZO, IGO, ZnO, graphene, or graphene oxide as a conductive material, but the present disclosure is not limited thereto.

The separation layer 2300 may be etched and removed later to separate the light-emitting elements 300 from the lower substrate 2000. The removal of the separation layer 2300 may be performed by the CLO method, and as a result, the surfaces of end portions of the light-emitting elements 300 may have substantially the same shape as the surface of the separation layer 2300. That is, the surfaces of the end portions of the light-emitting elements 300 may be flat.

Also, during the etching of a semiconductor structure 3000, the separation layer 2300 may perform the functions of an etching stopper between the semiconductor structure 3000 and the buffer material layer 2200. That is, during the etching of the semiconductor structure 3000, the separation layer 2300 may also be etched by the same process as, or a different process from, the semiconductor structure 3000.

However, the present disclosure is not limited to this. Alternatively, more than one separation layer 2300 may be disposed in the semiconductor structure 3000 or the lower substrate 2000 or in regions other than the interface between the buffer material layer 2200 and the first conductivity semiconductor layer 3100.

Figure 4:
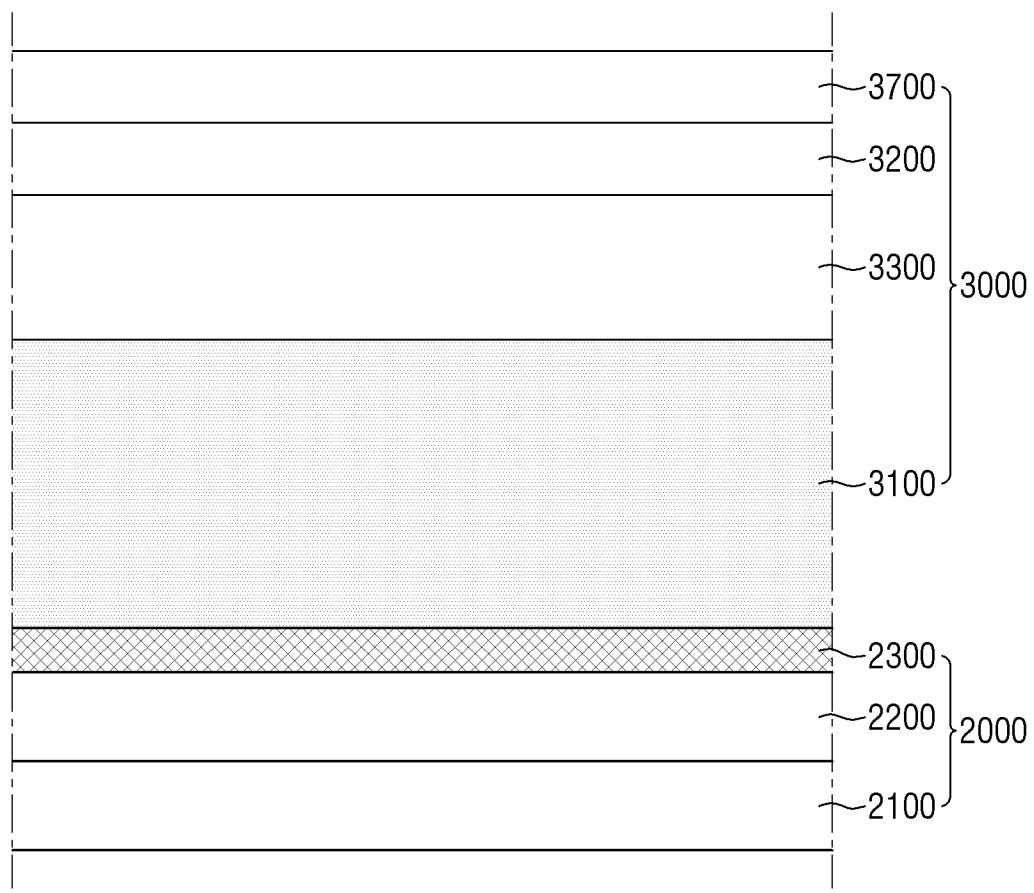

Thereafter, referring to FIG. 4, a semiconductor structure 3000 including the first conductivity semiconductor layer 3100, an active material layer 3300, a second conductivity semiconductor layer 3200, and a conductive electrode material layer 3700 is formed.

The semiconductor structure 3000 may be partially etched later, thereby forming semiconductor rods "ROD" (of FIG. 12). As already mentioned above, the semiconductor material layers included in the semiconductor structure 3000 may be formed by a typical process. The first conductivity semiconductor layer 3100, the active material layer 3300, the second conductivity semiconductor layer 3200, and the conductive electrode material layer 3700 may be sequentially formed and may include the same materials as a first conductivity semiconductor 310, an element active layer 330, a second conductivity semiconductor 320, and an electrode material layer 370, respectively, of each of the light-emitting elements 300. That is, the layers stacked in the semiconductor structure 3000 may correspond to the elements of each of the light-emitting elements 300.

Meanwhile, although not specifically illustrated, the conductive electrode material layer 3700 may not be provided in the semiconductor structure 3000, or another conductive electrode material layer may be further formed below the first conductivity semiconductor layer 3100. As already mentioned above, each of the light-emitting elements 300 may not include the electrode material layer 370 or may further include another electrode material layer 370 below the first conductivity semiconductor 310. That is, the semiconductor structure 3000 may further include members other than those illustrated in FIG. 4. However, the semiconductor structure 3000 will hereinafter be described as including the conductive electrode material layer 3700.

Thereafter, semiconductor crystals 3000' are formed by etching at least part of the semiconductor structure 3000 in a direction perpendicular to the lower substrate 2000.

Meanwhile, the forming of the semiconductor crystals 3000' by vertically etching the semiconductor structure 3000 may include a typical patterning process. For example, the forming of the semiconductor crystals 3000' by vertically etching the semiconductor structure 3000 may include forming an etching mask layer 1600 and an etching pattern layer 1700 on the semiconductor structure 3000, etching the semiconductor structure 3000 along the patterns of the etching pattern layer 1700, and removing the etching mask layer 1600 and the etching pattern layer 1700.

Figure 5:
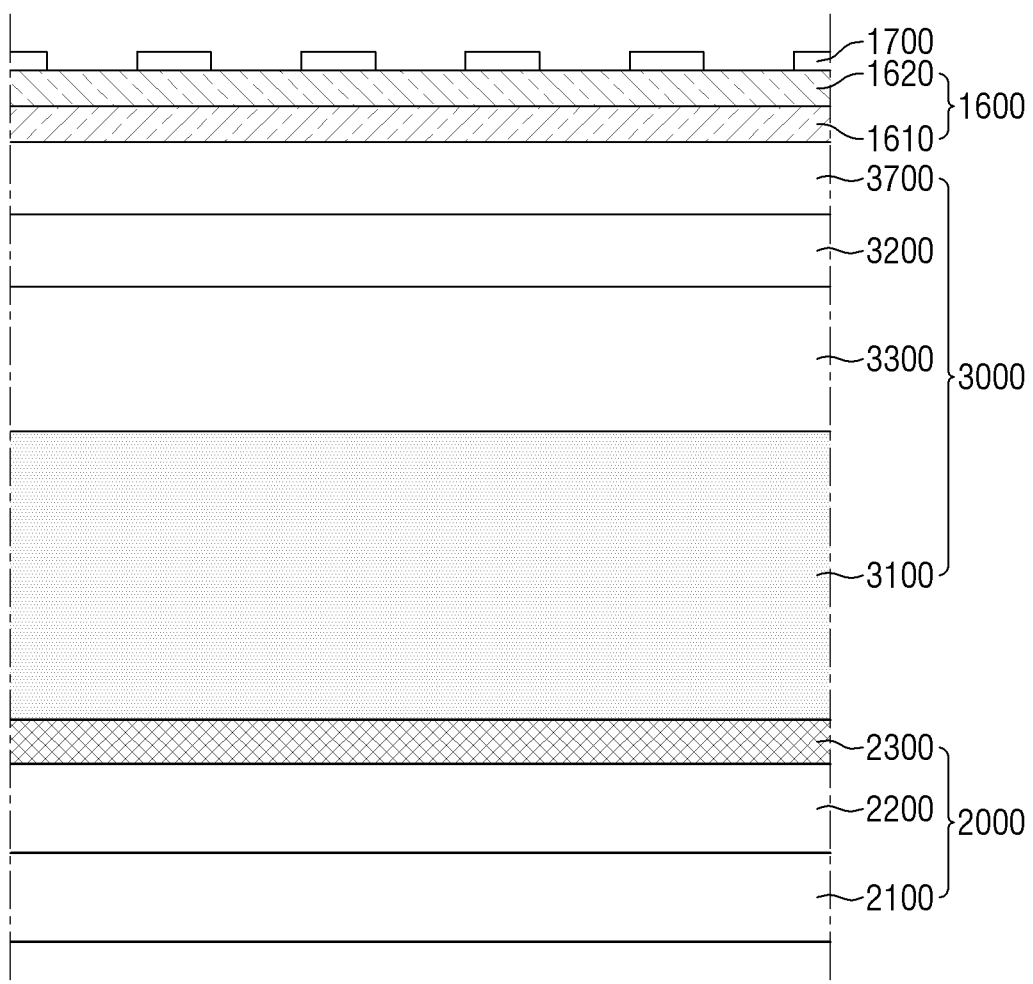

First, referring to FIG. 5, the etching mask layer 1600 may serve as a mask for the continuous etching of the first conductivity semiconductor layer 3100, the active material layer 3300, the second conductivity semiconductor layer 3200, and the conductive electrode material layer 3700 of the semiconductor structure 3000. The etching mask layer 1600 may include a first etching mask layer 1610, which includes an insulating material, and a second etching mask layer 1620, which includes a metal.

The insulating material included in the first etching mask layer 1610 of the etching mask layer 1600 may be an oxide or a nitride such as, for example, silicon oxide (SiOx), silicon nitride (SiNx), or silicon oxynitride (SiOxNy). The first etching mask layer 1610 may have a thickness of 0.5 μm to 1.5 μm, but the present disclosure is not limited thereto.

The material of the second etching mask layer 1620 is not particularly limited as long as it is a typical material that can perform the functions of a mask for the continuous etching of the semiconductor structure 3000. For example, the second etching mask layer 1620 may include chromium (Cr). The second etching mask layer 1620 may have a thickness of 30 nm to 150 nm, but the present disclosure is not limited thereto.

The etching pattern layer 1700, which is formed on the etching mask layer 1600, may include one or more nano patterns that are disposed to be spaced apart from one another. The etching pattern layer 1700 may serve as a mask for the continuous etching of the semiconductor structure 3000. The material of the etching pattern layer 1700 is not particularly limited as long as it includes a polymer, polystyrene sphere, silica sphere, or the like and can form patterns.

For example, in a case where the etching pattern layer 1700 includes a polymer, a typical patterning forming method using a polymer may be employed. For example, an etching pattern layer 1700 including a polymer may be formed by a method such as photolithography, e-beam lithography, nano-imprint lithography, or the like.

The structure, the type, and the distance between the patterns, of the etching pattern layer 1700 may be associated with the type of light-emitting elements 300 to be finally obtained. However, as already mentioned above, since the shape of the light-emitting elements 300 may vary, the structure of the etching pattern layer 1700 is not particularly limited. For example, in a case where the etching pattern layer 1700 includes circular patterns that are spaced apart from one another, the light-emitting elements 300, which are obtained by vertically etching the semiconductor structure 3000, may have a cylindrical shape.

For example, in the etching pattern layer 1700, one nano pattern may be disposed to be surrounded by other nano patterns. Here, six different nano-patterns may be arranged at equal intervals to surround the outer surface of a single nano pattern. That is, a region formed by a plurality of nano patterns may have a regular hexagonal shape, but the present disclosure is not limited thereto. Alternatively, the region formed by the plurality of nano patterns may have various other shapes such as a circular shape, a polygonal shape, or the like.

Also, the distance between the plurality of nano patterns is not particularly limited. The space between the plurality of nano patterns may be greater than the diameter of each of the plurality of nano patterns. For example, the distance between the plurality of nano patterns may be 2 to 4 times or 3 times greater than the diameter of each of the plurality of nano patterns. Also, the plurality of nanopatterns may have different diameters.

For example, the etching pattern layer 1700 may be formed by nano-imprint lithography, and the nano patterns of the etching pattern layer 1700 may include a nano-imprint resin. The nano-imprint resin may include a fluorinated monomer, an acrylate monomer, dipentaerythritol hexaacrylate, dipropylene glycol diacrylate, poly(ethylene glycol) phenyl ether acrylate, butylated hydroxy toluene (BHT), 1-hydroxy-cyclohexylphenylketone (Irgacure 184), or the like, but the present disclosure is not limited thereto.

Figure 6:
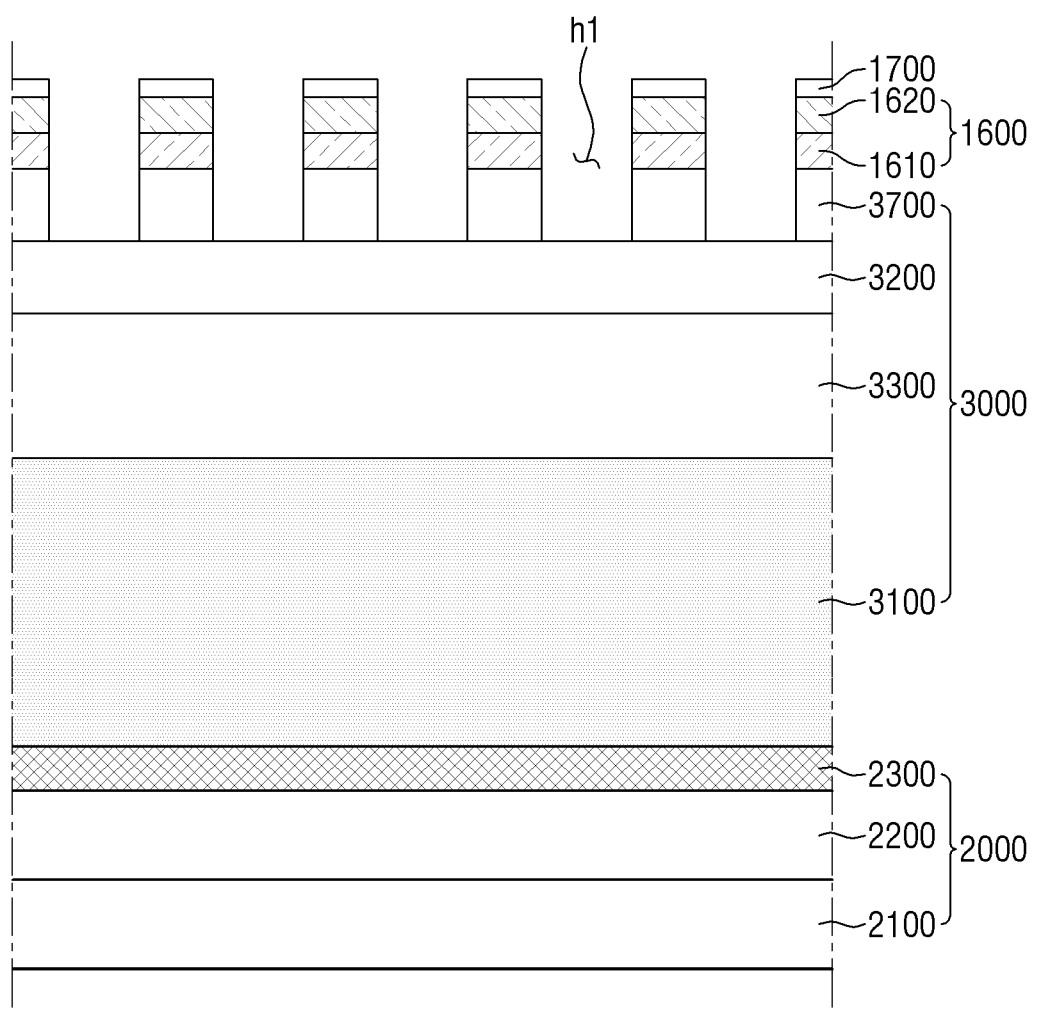
Figure 7:
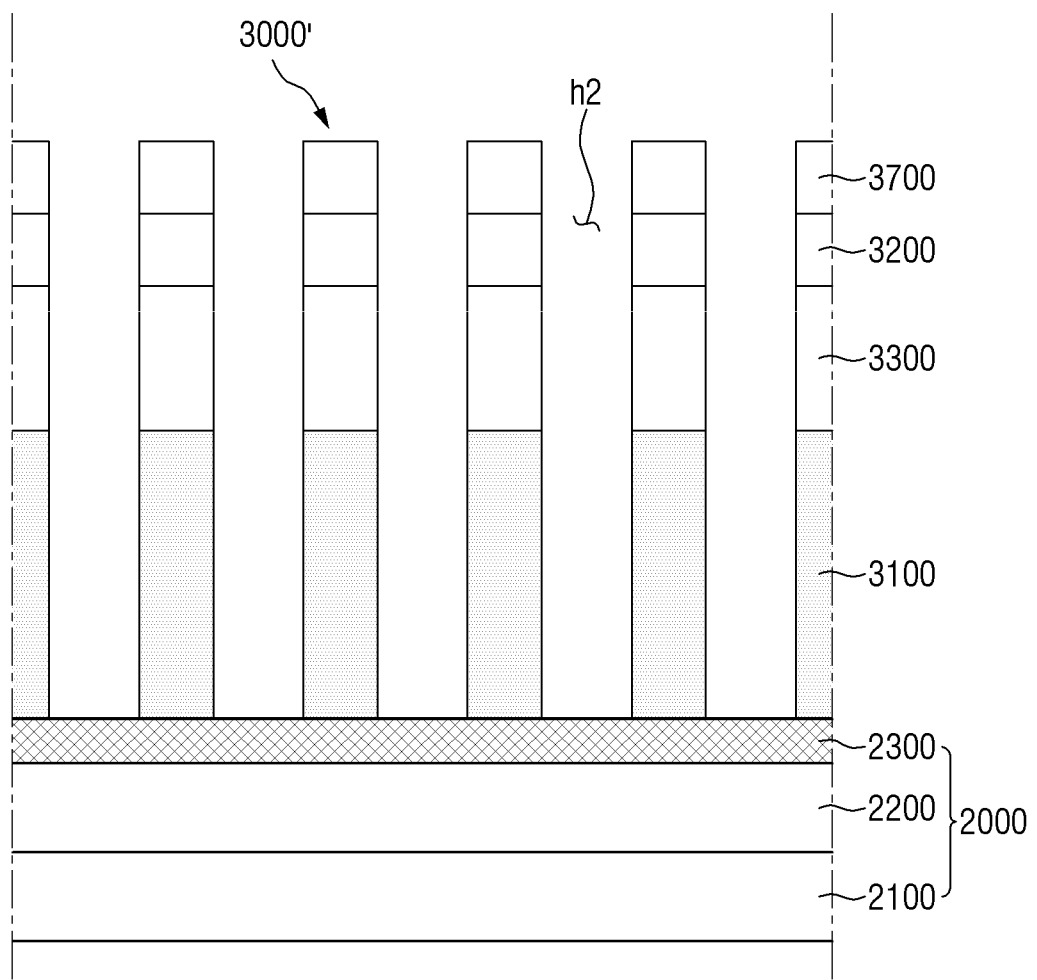

Thereafter, referring to FIGS. 6 and 7, the semiconductor crystals 3000' are formed by etching the semiconductor structure 3000 along the nano patterns of the etching pattern layer 1700. The forming of the semiconductor crystals 3000' may include: a first etching operation of forming first holes h1 by vertically etching the gaps between the nano patterns of the etching pattern layer 1700 to pattern the etching mask layer 1600 and the conductive electrode material layer 3700; an operation of removing the etching pattern layer 1700; a second etching operation of forming second holes h2 by etching the second conductivity semiconductor layer 3200, the active material layer 3300, and the first conductivity semiconductor layer 3100 along the first holes h1; and an operation of removing the etching mask layer 1600.

The forming of the first holes h1 and the second holes h2 may be performed by a typical method. For example, the first holes h1 and the second holes h2 may be formed by an etching method such as dry etching, wet etching, reactive ion etching (RIE), inductively coupled plasma-RIE (ICP-RIE), or the like. Dry etching, for example, can enable anisotropic etching and may thus be suitable for forming holes via vertical etching. In the case of using the above-described etching methods, Cl2 or O2 may be used as an etchant, but the present disclosure is not limited thereto.

In some embodiments, the etching of the semiconductor structure 3000 may be performed by both dry etching and wet etching. For example, the etching of the semiconductor structure 3000 may be performed first in a depth direction by a dry etching method, and the sidewalls of the semiconductor structure 3000 may be etched on a plane perpendicular to the surface of the semiconductor structure 3000 by a wet etching method, which is an isotropic etching method.

As illustrated in FIG. 6, the first holes h1 are formed by performing the first etching operation to etch the etching mask layer 1600 and the conductive electrode material layer 3700. Thereafter, the second etching operation that forms the second holes h2 is performed by etching the second conductivity semiconductor layer 3200, the active material layer 3300, and the first conductivity semiconductor layer 3100 along the first holes h1. Lastly, as illustrated in FIG. 7, the semiconductor crystals 3000' may be formed by removing parts of the etching mask layer 1600 or the etching pattern layer 1700 that remain on the etched semiconductor structure 3000. The etching mask layer 1600 or the etching pattern layer 1700 may be removed by a typical method such as, for example, a dry etching method or a wet etching method.

Meanwhile, the forming of the semiconductor crystals 3000' by etching the semiconductor structure 3000 may include the first and second etching operations and may perform different patterning processes, and even the first conductivity semiconductor layer 3100 may be patterned along the etching pattern layer 1700 by performing a single patterning process.

During the etching of the semiconductor structure 3000, at least part of the separation layer 2300 may also be etched, or the separation layer 2300 may be partially etched by a separate etching process. That is, the separation layer 2300 may be patterned by the same etching process as the semiconductor structure 3000, or may serve as an etching stopper during the etching of the semiconductor structure 3000 and may be patterned by a separate etching process.

For example, as illustrated, in a case where an etchant for patterning the semiconductor structure 3000 does not include an etchant for removing the separation layer 2300, only the semiconductor structure 3000 may be etched, and the separation layer 2300 may not be etched and may serve as an etching stopper. Accordingly, the semiconductor crystals 3000' may be formed, but the separation layer 2300 may remain unetched. On the contrary, although not specifically illustrated, the etchant for patterning the semiconductor structure 3000 includes the etchant for removing the separation layer 2300, the semiconductor structure 3000 and the separation layer 2300 may both be etched together.

Thereafter, semiconductor rods "ROD" are formed by forming an insulating layer 3800 to surround parts of the outer side surfaces of the semiconductor crystals 3000'.

The insulating layer 3800, which is an insulating material formed on the outer surfaces of the semiconductor rods "ROD", may be formed by applying an insulating material to the outer surfaces of the semiconductor crystals 3000', which are vertically etched, or immersing the semiconductor crystals 3000' in an insulating material, but the present disclosure is not limited thereto. For example, the insulating layer 3800 may be formed by atomic layer deposition (ALD). The insulating layer 3800 may form insulating films 380 of the light-emitting elements 300. As already mentioned above, the insulating layer 3800 may include silicon oxide (SiOx), silicon nitride (SiNx), silicon oxynitride (SiOxNy), aluminum oxide (Al2O3), or aluminum nitride (AlN).

Figure 8:
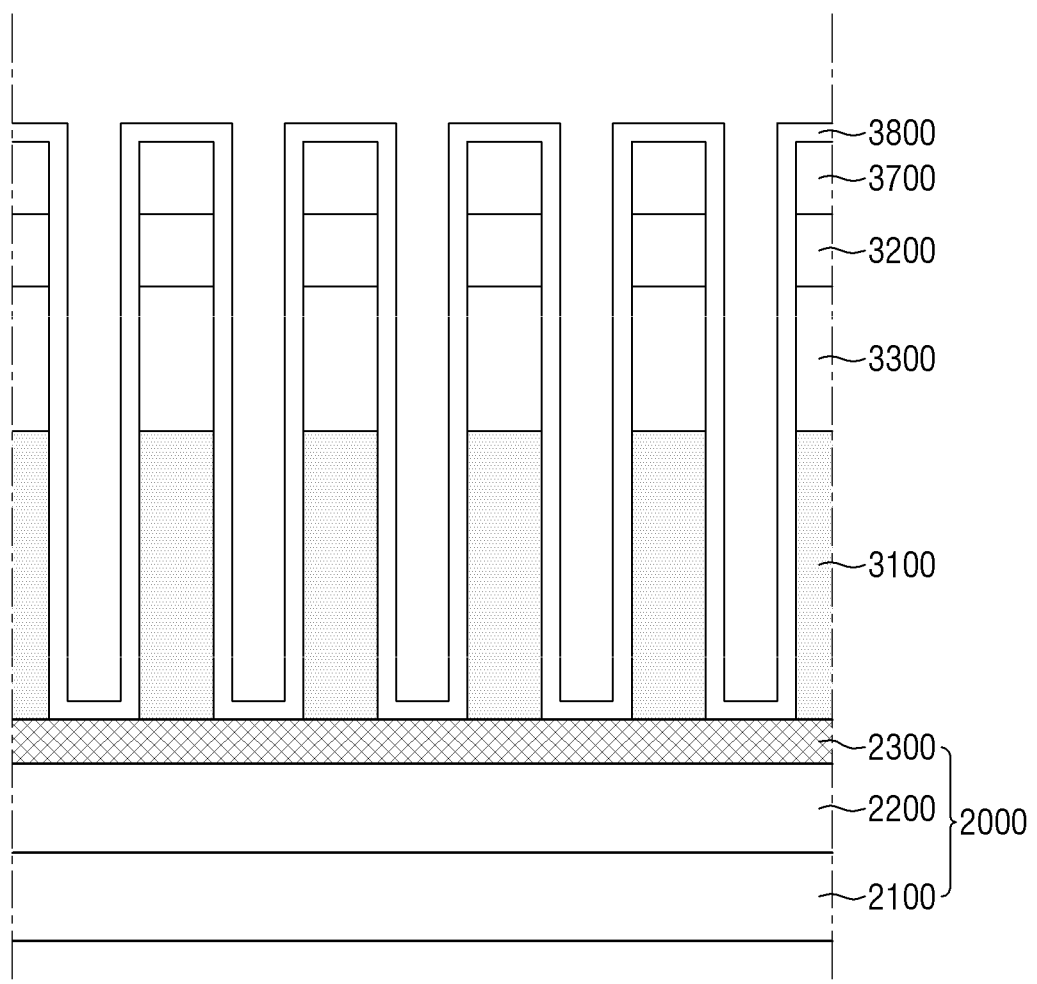
Figure 9:
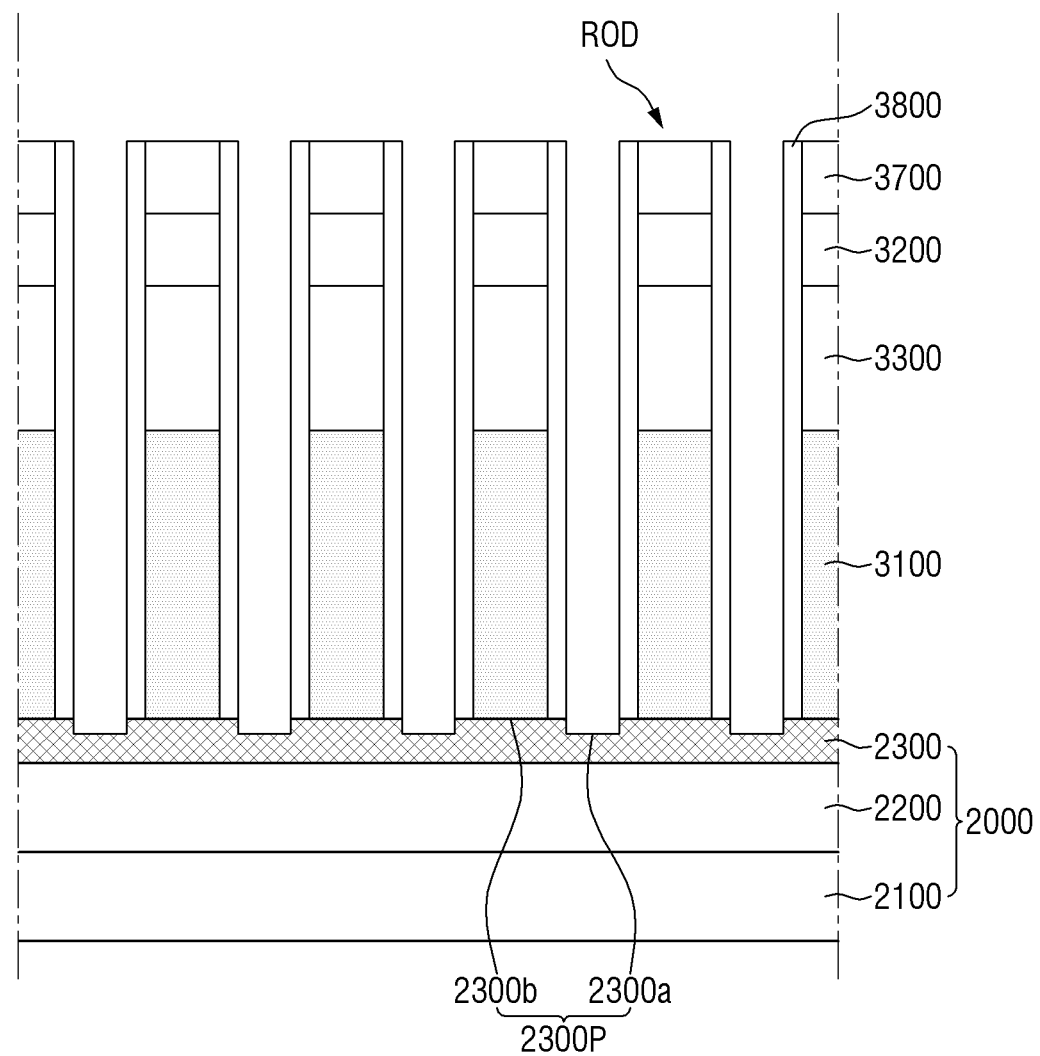

Referring to FIG. 8, the insulating layer 3800 may be formed on the side surfaces and the top surfaces of the semiconductor crystals 3000' and on parts of the separation layer 2300 or the buffer material layer 2200 that are exposed due to the gaps between the semiconductor crystals 3000' being etched. To expose both ends of the semiconductor crystals 3000', parts of the insulating layer 3800 formed on the top surfaces of the semiconductor crystals 3000' need to be removed. Thus, parts of the insulating layer 3800 formed in a direction perpendicular to the length direction of the semiconductor crystals 3000', i.e., in a direction parallel to the lower substrate 2000, may be removed. That is, as illustrated in FIG. 9, the top surfaces of the semiconductor crystals 3000' may be exposed by removing parts of the insulating layer 3800 disposed on at least the top surfaces of the semiconductor crystals 3000' and on the separation layer 2300. To this end, a process such as a dry etching process, which is an anisotropic etching process, or an etch-back process may be performed. As a result, the insulating layer 3800 that surrounds the outer circumferential surfaces of the semiconductor crystals 3000' may be partially removed, and the semiconductor rods "ROD" including the semiconductor crystals 3000' and the insulating layer 3800 may be formed. The semiconductor rods "ROD" may be separated from the lower substrate 2000, thereby obtaining the light-emitting elements 300.

Meanwhile, during the removal of the insulating layer 3800, uneven patterns 2300P including one or more grooves 2300a, which are parts of the separation layer 2300 that are depressed, and protrusions 2300b, which are formed due to the grooves 2300a being spaced apart from one another, may be formed in the separation layer 2300.

As the insulating layer 3800 and the separation layer 2300 have different etching selection ratios, the separation layer 2300 may be partially removed during the removal of the insulating layer 3800. Parts of the separation layer 2300 may be depressed in the process of partially removing the insulating layer 3800, and as a result, the grooves 2300a may be formed.

As illustrated in the drawings, the separation layer 2300 may be partially etched along the second holes h2, by which the semiconductor rods "ROD" are spaced apart from one another. The etched parts of the separation layer 2300 may be depressed to form the grooves 2300a. That is, the grooves 2300a may be formed as the extensions of the second holes h2 into the separation layer 2300. A plurality of grooves 2300a may be formed in the separation layer 2300, and parts of the separation layer 2300 between the grooves 2300a may be relatively projected to form the protrusions 2300b. The protrusions 2300b may be regions that are not etched due to the semiconductor rods "ROD". In other words, the semiconductor rods "ROD" may be formed on the protrusions 2300b.

As already mentioned above, the uneven patterns 2300P of the separation layer 2300 may be formed along the second holes h2, which are formed in the process of etching the semiconductor structure 3000 in a direction perpendicular to the lower substrate 2000. Since the uneven patterns 2300P are formed along the structure of the etching pattern layer 1700, the structure of the uneven patterns 2300P may vary depending on the structure of the etching pattern layer 1700. The uneven patterns 2300P of the separation layer 2300 illustrates that the grooves 2300a have the same diameter and are spaced at equal intervals, but the present disclosure is not limited thereto. To fabricate light-emitting elements 300 having different diameters, the nano patterns of the etching pattern layer 1700 may be formed to have different diameters or to be spaced at different intervals.

Accordingly, the grooves 2300a of the uneven patterns 2300P of the separation layer 2300 may have different diameters or may be spaced at different intervals. That is, the grooves 2300a and the protrusions 2300b of the uneven patterns 2300P may have different diameters.

Meanwhile, the separation layer 2300 may not include the uneven patterns 2300P, but may have a substantially flat top surface.

The semiconductor rods "ROD" may be separated from the lower substrate 2000 to form the light-emitting elements 300. The separation of the semiconductor rods "ROD" may include removing the separation layer 2300 by CLO. To remove the separation layer 2300, a wet etching process may be performed using an etchant for separation such as hydrofluoric acid (HF) or buffered oxide etch (BOE), but the present disclosure is not limited thereto.

Here, the etchant for separation may react with the conductive electrode material layer 3700 or the insulating layer 3800 of the semiconductor rods "ROD". As a result, the outer circumferential surfaces of the light-emitting elements 300 may be rough, or the electrode material layers 370 of the light-emitting elements 300 may be partially removed.

Figure 10:
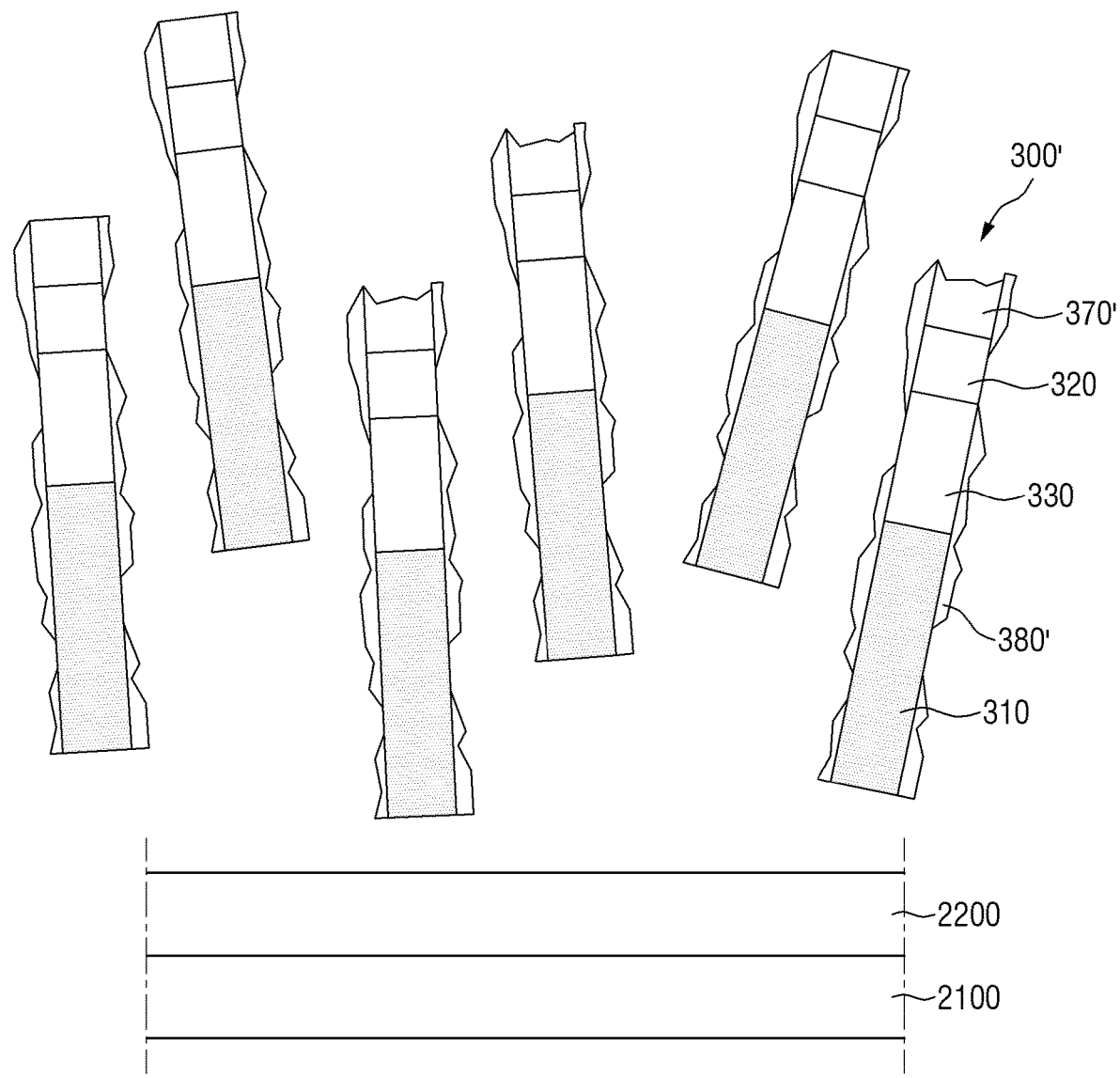
FIG. 10 is a schematic view illustrating a method of fabricating a light-emitting element according to a comparative example.

FIG. 10 is a schematic view illustrating a method of fabricating a light-emitting element according to a comparative example.

Referring to FIG. 10, in the case of directly separating semiconductor rods "ROD" from a lower substrate 2000, some of the materials included in an insulating layer 3800 and a conductive electrode material layer 3700 may be partially damaged when separating a separation layer 2300. As a result, the surfaces of insulating films 380' of light-emitting elements 300' may become rough, and electrode material layers 370' of the light-emitting elements 300' may be partially removed. In this case, conductivity semiconductors (310 and 320) or element active layers 330 of the light-emitting elements 300' may be partially exposed and damaged, and contact failure may occur between the light-emitting elements 300' and the electrodes of a display device 10 due to the insulating films 380' having rough surfaces.

The method of fabricating a light-emitting element 300 according to some embodiments of the present disclosure includes forming the rod structure 1000 including the rod protecting layer 1100, which surrounds the semiconductor rods "ROD" (S200). The rod protecting layer 1100 may include an organic material that does not react with an etchant for separation for removing the separation layer 2300. The rod protecting layer 1100 may be formed such that the semiconductor rods "ROD" are not in contact with the etchant for separation, and can prevent the semiconductor rods "ROD" from being damaged by the etchant for separation when the separation layer 2300 is being removed.

Figure 11:
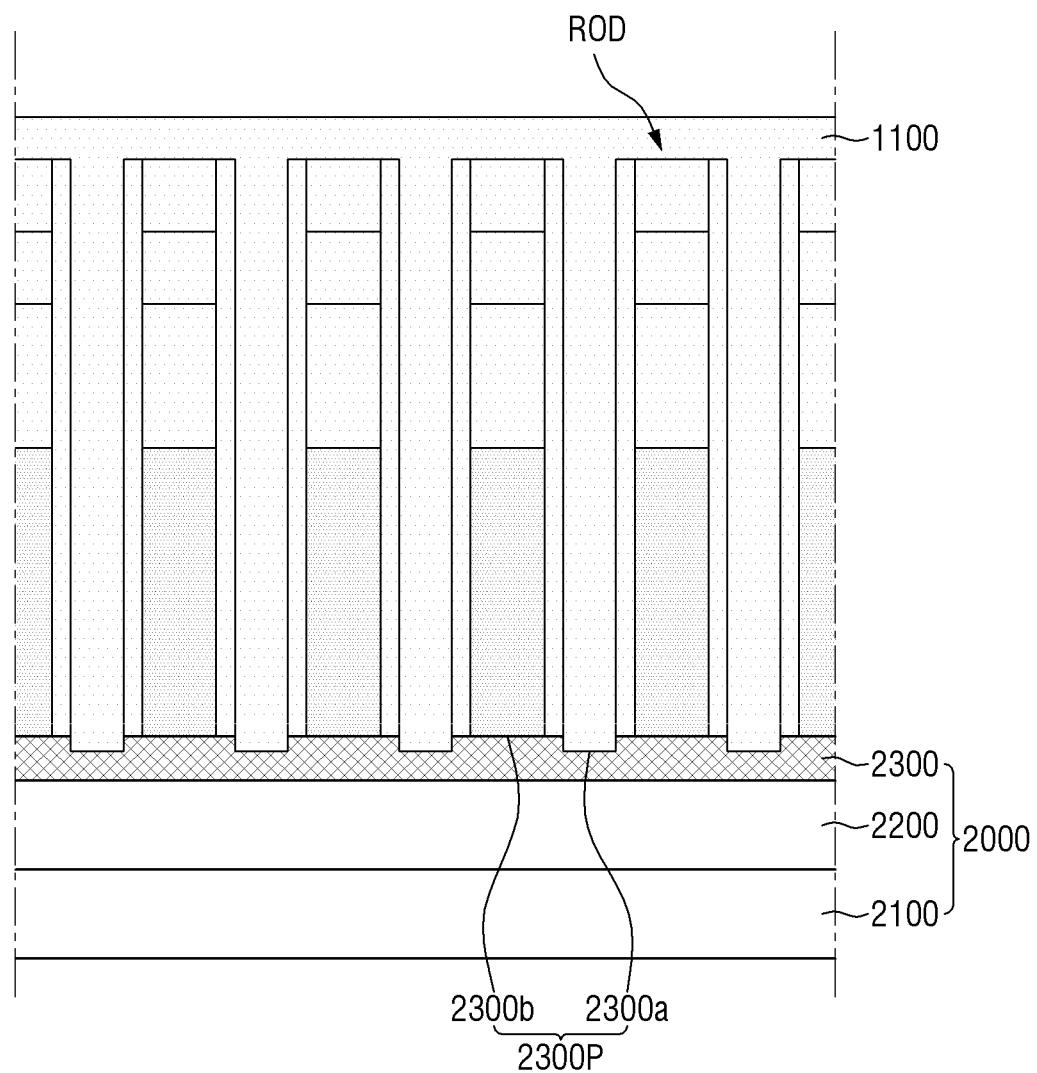
FIGS. 11 through 13 are schematic views illustrating a method of forming a rod structure according to some embodiments of the present disclosure.
Figure 12:
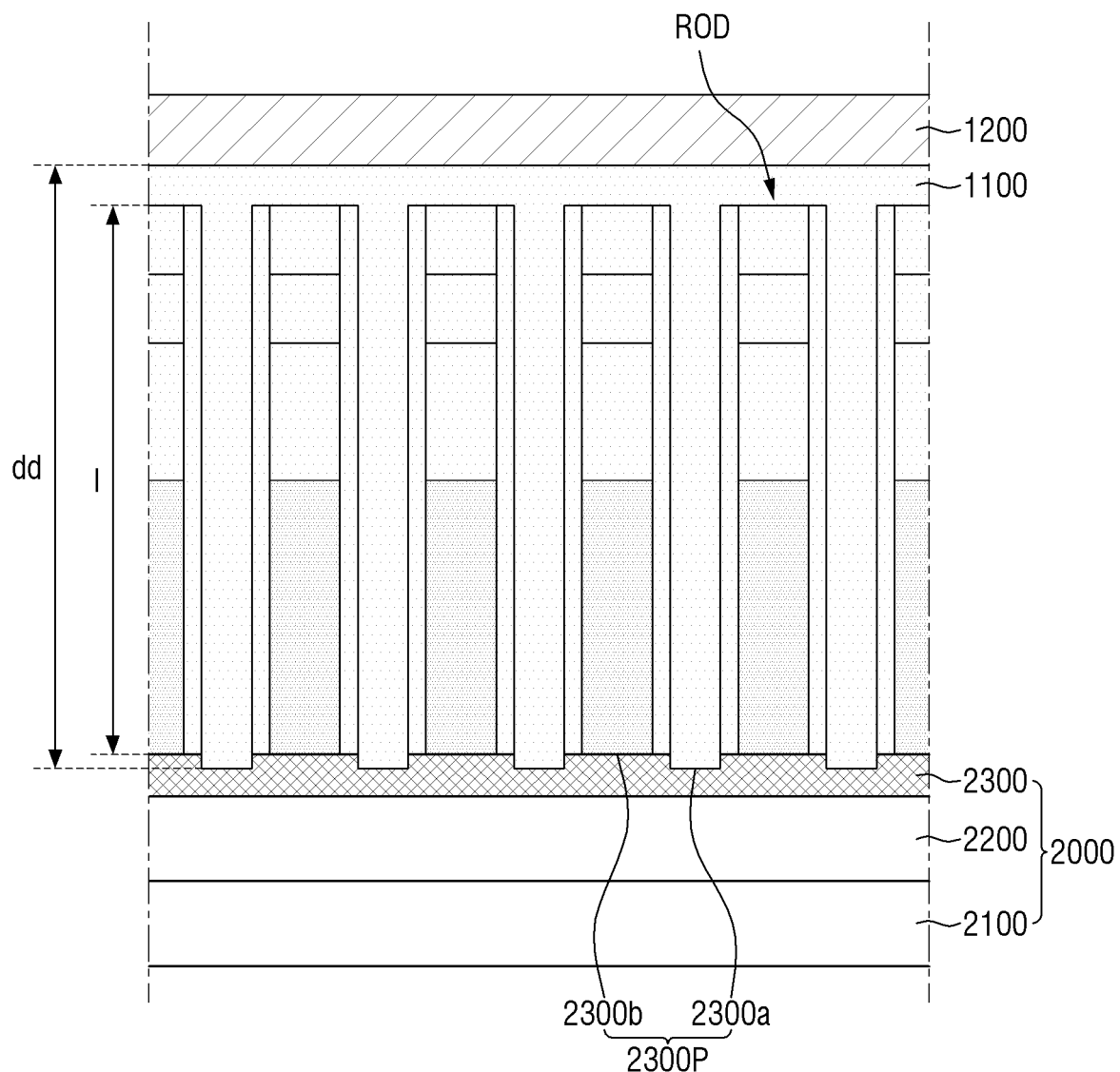
Figure 13:
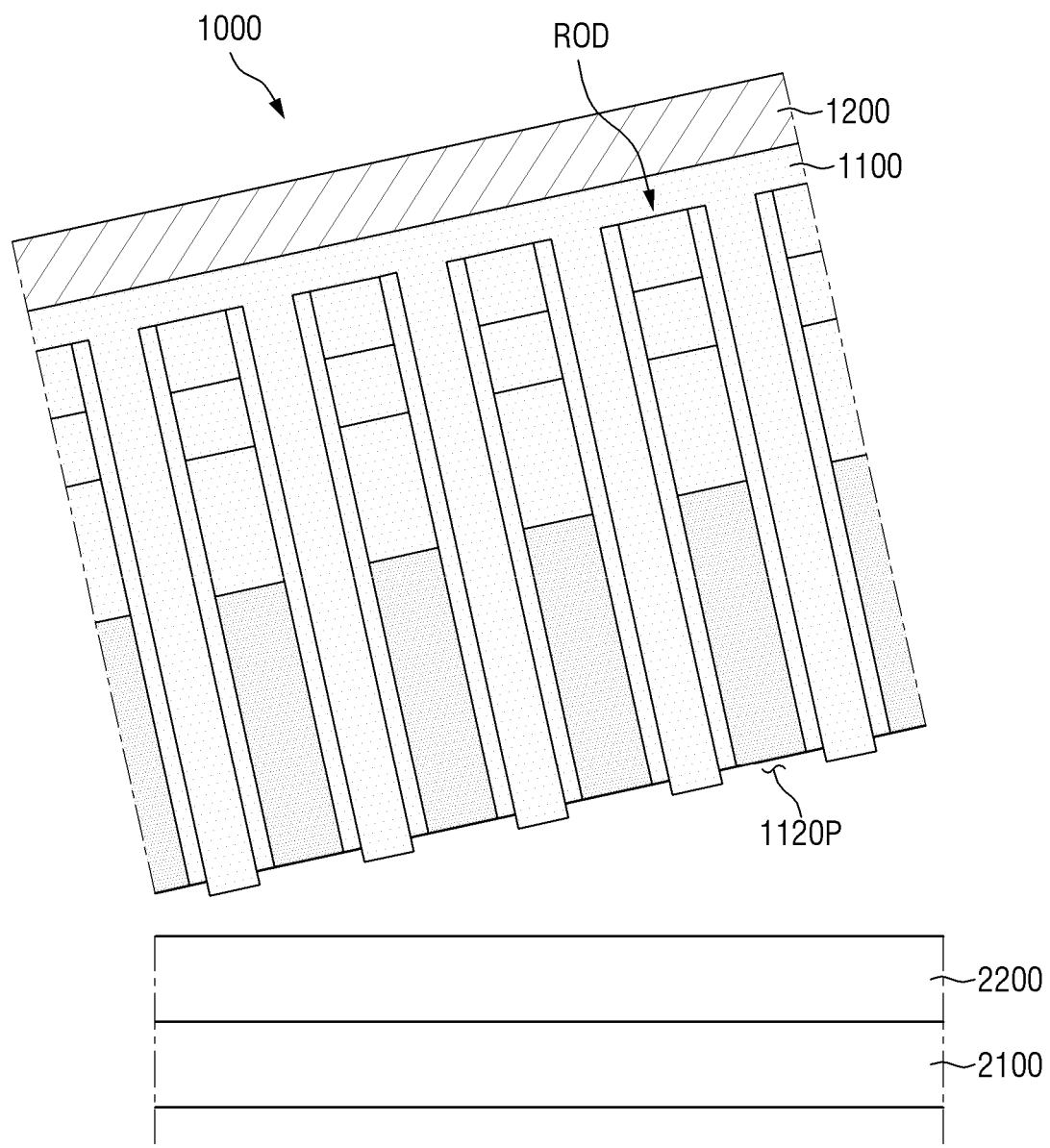

FIGS. 11 through 13 are schematic views illustrating a method of forming a rod structure according to some embodiments of the present disclosure.

The method of forming a rod structure 1000 according to some embodiments of the present disclosure includes forming a rod protecting layer 1100, which surrounds semiconductor rods "ROD", forming an auxiliary layer 1200 on the rod protecting layer 1100, and separating the rod structure 1000 from a lower substrate 2000.

First, referring to FIG. 11, the rod protecting layer 1100, which surrounds the semiconductor rods "ROD", is formed on a separation layer 2300.

The rod protecting layer 1100 may be formed on the separation layer 2300 to surround the semiconductor rods "ROD". A thickness dd of the rod protecting layer 1100 may be greater than a length l of the long axes of the semiconductor rods "ROD" such that the rod protecting layer 1100 may cover top surfaces of the semiconductor rods "ROD", for example, the top surface of a conductive electrode material layer 3700. That is, the rod protecting layer 1100 may be formed such that the semiconductor rods "ROD" may be placed in the rod protecting layer 1100. For example, in a case where the length of the long axes of the semiconductor rods "ROD" is 4 to 7 μm, the thickness of the rod protecting layer 1100 may be 6 μm to 10 μm, but the present disclosure is not limited thereto. The rod protecting layer 1100 may be in the form of a film, a tape, or a substrate.

A top surface 1110 of the rod protecting layer 1100 may be formed to be substantially flat and may form a parallel plane with respect to the lower substrate 2000. As will be described later, the auxiliary layer 1200 may be formed on the top surface 1110 of the rod protecting layer 1100. The rod protecting layer 1100 with the auxiliary layer 1200 formed thereon may form the rod structure 1000.

A bottom surface 1120 of the rod protecting layer 1100 may be formed to be in contact with the separation layer 2300. As already mentioned above, uneven patterns 2300P including grooves 2300a and protrusions 2300b may be formed on the separation layer 2300, and the top surface of the separation layer 2300 may not be flat. The bottom surface 1120 of the rod protecting layer 1100 may be formed along the uneven patterns 2300P of the separation layer 2300.

In some embodiments, the bottom surface 1120 of the rod protecting layer 1100 may be in contact with the top surfaces of the grooves 2300a of the separation layer 2300 and may be formed to surround the side surfaces of the protrusions 2300b.

To protect the semiconductor rods "ROD", which are formed on the protrusions 2300b, the rod protecting layer 1100 is formed to surround the top surfaces and the side surfaces of the semiconductor rods "ROD". Here, in a case where gaps are formed between the side surfaces and the bottom surfaces of the semiconductor rods "ROD", the bottom surfaces of the semiconductor rods "ROD" may be damaged by an etchant for separation when the separation layer 2300 is being removed. To prevent this, the rod protecting layer 1100 may be disposed to surround not only the side surfaces of the semiconductor rods "ROD", but also the side surfaces of the protrusions 2300b of the separation layer 2300, which are in contact with the bottom surface of the rod protecting layer 1100. Accordingly, depressions 1120P, which are at least parts of the bottom surface 1120 of the rod protecting layer 1100 that are depressed, may be formed on the bottom surface 1120 of the rod protecting layer 1100, which is formed along the uneven patterns 2300P of the separation layer 2300. This will be described later in detail.

Meanwhile, the rod protecting layer 1100 may be formed by applying or spraying a material for forming the rod protecting layer 1100 on the semiconductor rods "ROD". In some embodiments, the rod protecting layer 1100 may be formed on the separation layer 2300 by inkjet printing, spin coating, die-slot coating, slit coating, or the like, but the present disclosure is not limited thereto.

The rod protecting layer 1100 may include an organic material that is insoluble in the etchant for separation for removing the separation layer 2300. The rod protecting layer 1100 may be a type of organic protective film. As will be described later, the separation layer 2300 may be chemically removed through the reaction with the etchant for separation when separating the rod structure 1000 from the lower substrate 2000. On the contrary, the rod protecting layer 1100 may include a material that does not react with the etchant for separation and may thus prevent the semiconductor rods "ROD" from being damaged by the etchant for separation.

For example, the separation layer 2300 may be removed by an etchant for separation containing fluorine (F), and the rod protecting layer 1100 may include an organic material that is insoluble in the etchant for separation. During the removal of the separation layer 2300, the rod protecting layer 1100 may not react with the etchant for separation containing F. Accordingly, the rod protecting layer 1100 can prevent the semiconductor rods "ROD" from being in contact with the etchant for separation and can protect the semiconductor rods "ROD".

The organic material of the rod protecting layer 1100 may be dissolved in a solvent other than the etchant for separation. That is, the organic material may be insoluble in the etchant for separation containing F, but may be dissolved in other solvents such as, for example, water, acetone, isopropyl alcohol (IPA), or the like. Thus, the rod protecting layer 1100 may not react with the etchant for separation, but may be dissolved in other solvents, thereby facilitating the separation of the semiconductor rods "ROD".

For example, the organic material of the rod protecting layer 1100 may include at least one of polymethyl methacrylate (PMMA), photoresist (PR), poly-(3,4-ethylenedioxy thiophene)polystyrene sulfonate (PEDOT:PSS). For example, the separation layer 2300 may include a material that is removable by an etchant containing F, such as, for example, silicon oxide (SiOx), and the rod protecting layer 1100 may include PEDOT:PSS. During the separation of the rod structure 1000 from the lower substrate 2000, the separation layer 2300 is etched or dissolved away by the etchant containing F, but the PEDOT:PSS of the rod protecting layer 1100 is not dissolved by F. The PEDOT:PSS of the rod protecting layer 1100 may be easily removed later by being dissolved in water or the like, but the present disclosure is not limited thereto.

Thereafter, referring to FIG. 12, the auxiliary layer 1200 is formed on the rod protecting layer 1100, thereby obtaining the rod structure 1000.

The auxiliary layer 1200 may be formed on the rod protecting layer 1100. As illustrated in the drawings, the auxiliary layer 1200 may be formed on the top surface 1110 of the rod protecting layer 1100, but the present disclosure is not limited thereto. Alternatively, the auxiliary layer 1200 may be formed on the sides of the rod protecting layer 1100.

The auxiliary layer 1200 may include a more rigid material than the rod protecting layer 1100. For example, the auxiliary layer 1200 may be a thermal release tape (TRT), polyethylene terephthalate (PET), a plastic film, or the like, but the present disclosure is not limited thereto.

The rod protecting layer 1100 may include a more flexible organic material than the auxiliary layer 1200. Accordingly, the rod protecting layer 1100 may be formed on the semiconductor rods "ROD" by a method such as slit coating. As the auxiliary layer 1200 including a relatively rigid material is formed on the rod protecting layer 1100, the rod structure 1000 can maintain a predetermined shape even after separated from the lower substrate 2000. Accordingly, the rod structure 1000 can easily store and transport the semiconductor rods "ROD".

Lastly, referring to FIG. 13, the lower substrate 2000 is separated from the rod structure 1000. As already mentioned above, the separation of the rod structure 1000 from the lower substrate 2000 may be performed by dissolving or etching the separation layer 2300 with the etchant for separation.

The rod structure 1000 includes the rod protecting layer 1100 and the auxiliary layer 1200, and a plurality of semiconductor rods "ROD" may be disposed in the rod protecting layer 1100. The rod structure 1000 includes the rod protecting layer 1100 that does not react with the etchant for separation that the separation layer 2300 reacts with and can thus protect the semiconductor rods "ROD". Also, the plurality of semiconductor rods "ROD" can be easily stored and carried by forming the auxiliary layer 1200, which includes a relatively rigid material, on the rod protecting layer 1100.

Figure 14:
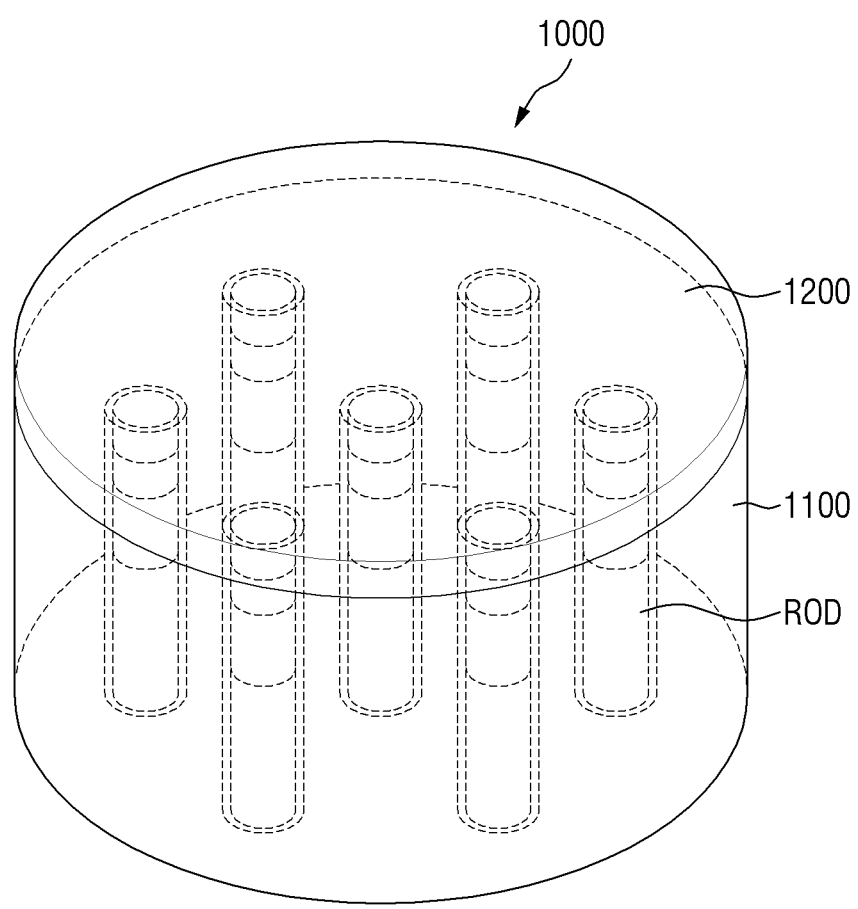
FIGS. 14 and 15 are schematic views of a rod structure according to some embodiments of the present disclosure.
Figure 15:
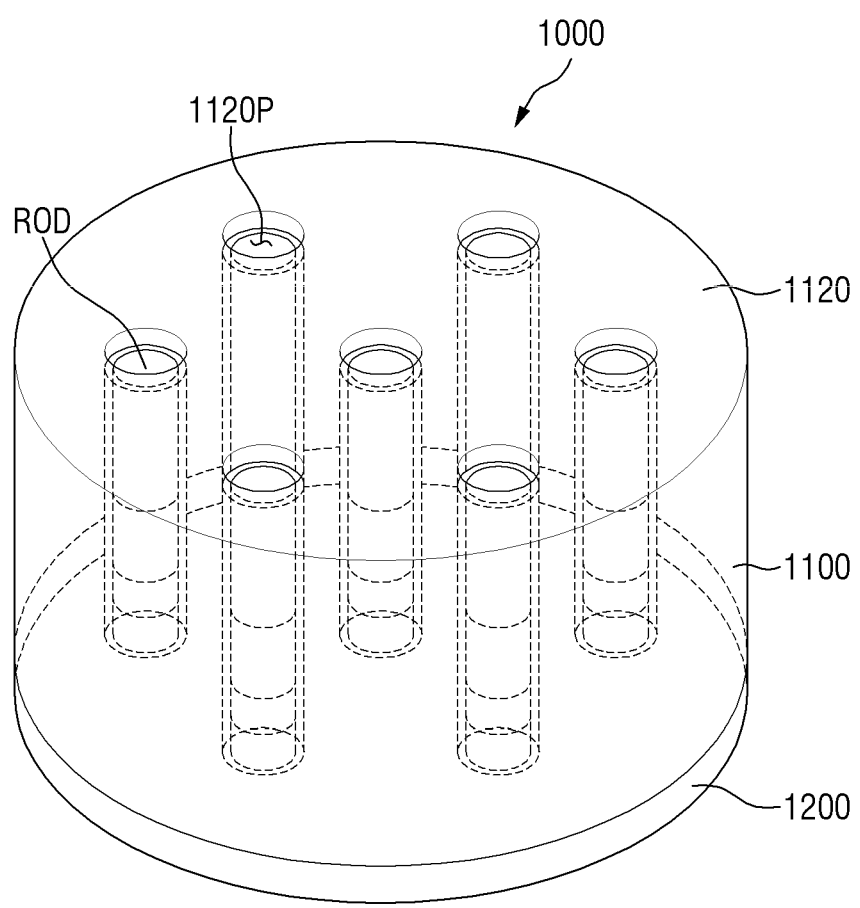

FIGS. 14 and 15 are schematic views of a rod structure according to some embodiments of the present disclosure. FIG. 14 is a perspective view of the rod structure 1000, as viewed from above the rod structure 1000, and FIG. 15 is a perspective view of the rod structure 1000, as viewed from below the rod structure 1000.

Referring to FIGS. 14 and 15, the rod structure 1000 may have a cylindrical shape. In a case where the lower substrate 2000 includes a circular base substrate 2100, the rod structure 1000 may have a cylindrical shape, but the present disclosure is not limited thereto. The rod structure 1000 is merely an example, and the shape of the rod structure 1000 may vary.

One or more semiconductor rods "ROD" may be disposed in the rod protecting layer 1100 of the rod structure 1000.

The semiconductor rods "ROD", which are grown on the separation layer 2300 to be spaced apart from one another, may be arranged in the rod protecting layer 1100. Six semiconductor rods "ROD" are illustrated as being arranged around one semiconductor rod "ROD" at their center. However, the rod protecting layer 1100 may have more semiconductor rods "ROD" than there are in the example of FIGS. 14 and 15 arranged therein. Also, the distance between, and the arrangement of, the semiconductor rods "ROD" may vary depending on how the semiconductor rods "ROD" are formed on the lower substrate 2000.

For example, a plurality of semiconductor rods "ROD" may be arranged to be spaced apart from one another in a direction parallel to the top surface 1110 of the rod protecting layer 1100. Also, the long axes of the semiconductor rods "ROD", which are arranged in the rod structure 1000, may extend in a direction perpendicular to the top surface 1110 of the rod protecting layer 1100.

As already mentioned above, the semiconductor rods "ROD" may be grown on the lower substrate 2000, and the rod protecting layer 1100 may be formed to surround the semiconductor rods "ROD". The direction in which the semiconductor rods "ROD" are grown, i.e., the direction in which the first conductivity semiconductor layer 3100, the active material layer 3300, and the second conductivity semiconductor layer 3200 are stacked, may be parallel to a direction perpendicular to the lower substrate 2000. Accordingly, the semiconductor rods "ROD", which are arranged in the rod protecting layer 1100, may be aligned such that the long axes of the semiconductor rods "ROD" (e.g., the direction in which the semiconductor rods "ROD" are grown) may be perpendicular to the top surface 1110 of the rod protecting layer 1100.

Also, the semiconductor rods "ROD" may be disposed to be spaced apart in a direction perpendicular to the long axes of the semiconductor rods "ROD" (e.g., the direction in which the semiconductor rods "ROD" are grown), for example, the direction parallel to the lower substrate 2000. Accordingly, as illustrated, the semiconductor rods "ROD" may be arranged in the direction parallel to the top surface 1110 of the rod protecting layer 1100.

Meanwhile, one surface of the rod protecting layer 1100 of the rod structure 1000 may be substantially flat, and the other surface of the rod protecting layer 1100 may include one or more depressions 1120P, which are formed due to areas that overlap with the semiconductor rods "ROD" being depressed.

The bottom surface 1120 of the rod protecting layer 1100 may be formed along the uneven patterns 2300P of the separation layer 2300 to surround the semiconductor rods "ROD", which are grown on the lower substrate 2000. The rod structure 1000, separated from the lower substrate 2000 by removing the separation layer 2300, includes the rod protecting layer 1100 in which the depressions 1120P, which are parts of the bottom surface 1120 of the rod structure 1000 that are depressed. First end portions of the semiconductor rods "ROD" may face the top surface 1110 of the rod protecting layer 1100, and second end portions of the semiconductor rods "ROD" may be in contact with the depressions 1120P, which are formed on the bottom surface 1120 of the rod protecting layer 1100. Accordingly, the second end portions of the semiconductor rods "ROD" that face the bottom surface 1120 of the rod protecting layer 1100 may be partially exposed in the rod structure 1000. However, since the semiconductor rods "ROD" are protected by the rod protecting layer 1100 when the separation layer 2300 is being removed, damage to the material thereof can be minimized.

Meanwhile, the rod structure 1000 may include the auxiliary layer 1200, which is formed on at least part of the rod protecting layer 1100. The auxiliary layer 1200 is illustrated as being formed on the top surface of the rod protecting layer 1100, but the present disclosure is not limited thereto. The auxiliary layer 1200 may not be formed on the surface of the rod protecting layer 1100 where the depressions 1120P are formed.

The method of fabricating a light-emitting element 300 according some embodiments of the present disclosure includes forming the rod structure 1000 and can easily store and transport the semiconductor rods "ROD" that are manufactured. Also, the rod protecting layer 1100 of the rod structure 1000 can prevent damage to the semiconductor rods "ROD".

The semiconductor rods "ROD", for example, the light-emitting elements 300, may be included in the display device 10 and may emit light of a particular wavelength range. As will be described later, the light-emitting elements 300 may be sprayed onto the electrodes of the display device 10 in a state of being dispersed in element ink S (of FIG. 19). However, the light-emitting elements 300, which include a semiconductor material and thus have a large specific gravity, may not be able to remain dispersed for a long period of time, but may be deposited.

On the contrary, the method of fabricating a light-emitting element 300 according to some embodiments of the present disclosure can easily store the light-emitting elements 300 yet to be dispersed in the element ink S, by forming the rod structure 1000. That is, the light-emitting elements 300, which are fabricated by epitaxial growth, can be stored for a long period of time before the manufacture of the display device 10 and can be easily transported, as necessary.

Thereafter, the method of fabricating a light-emitting element 300 according to some embodiments of the present disclosure may include separating the semiconductor rods "ROD" from the rod structure 1000 (S300). The rod protecting layer 1100 and the auxiliary layer 1200 of the rod structure 1000 may be removed, thereby obtaining the semiconductor rods "ROD", i.e., the light-emitting elements 300.

Figure 16:
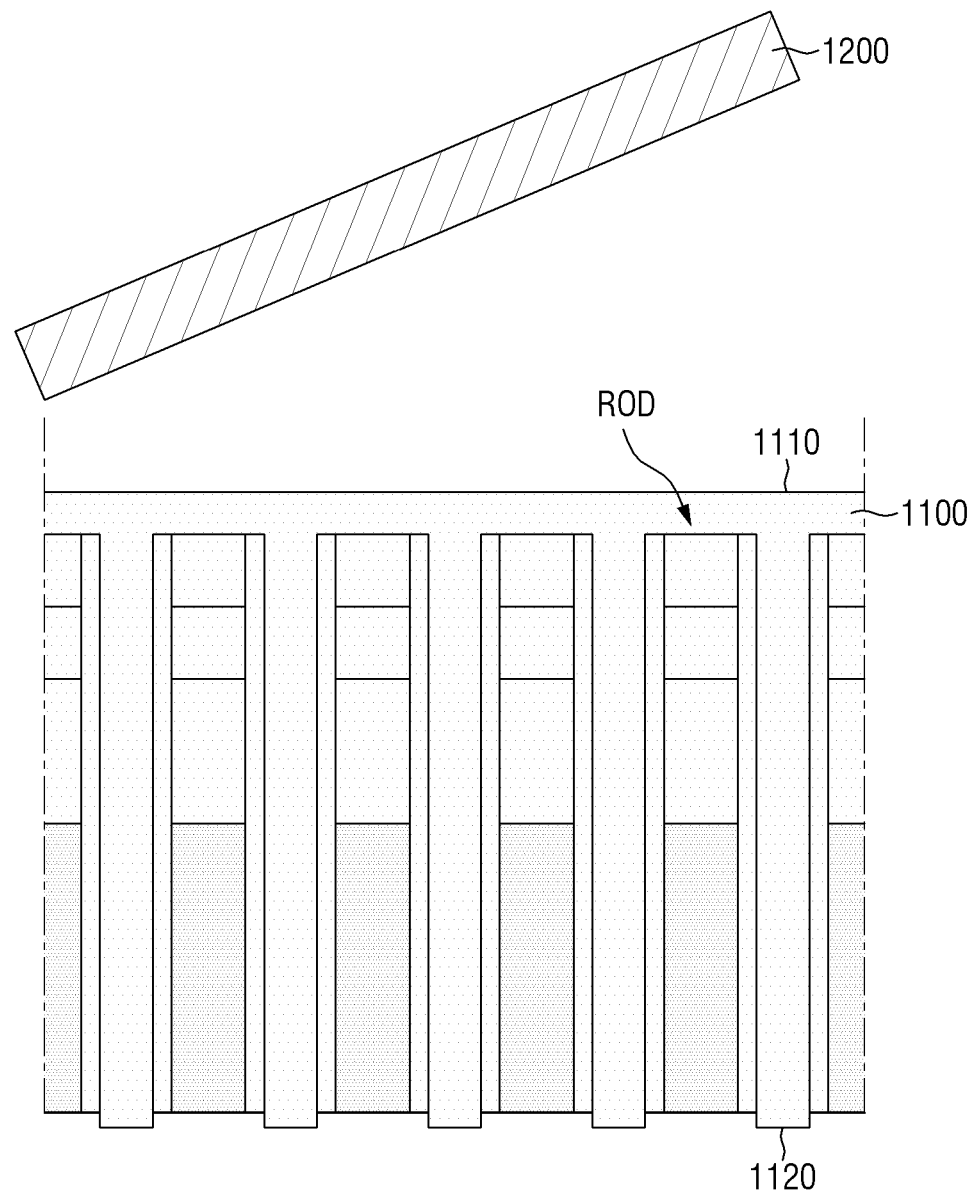
FIGS. 16 through 18 are schematic views illustrating how to separate semiconductor rods from the rod structure according to some embodiments of the present disclosure.
Figure 17:
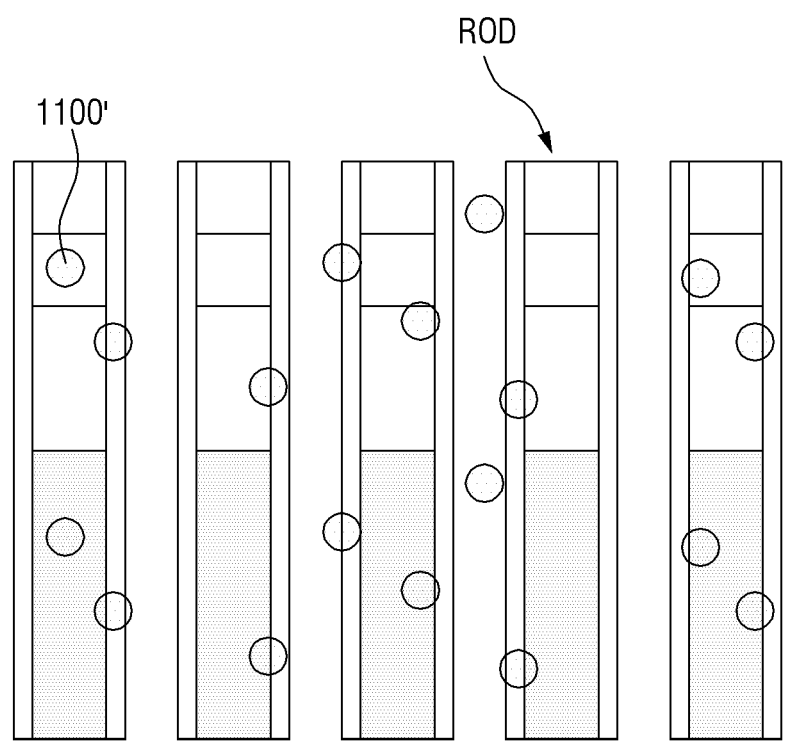
Figure 18:
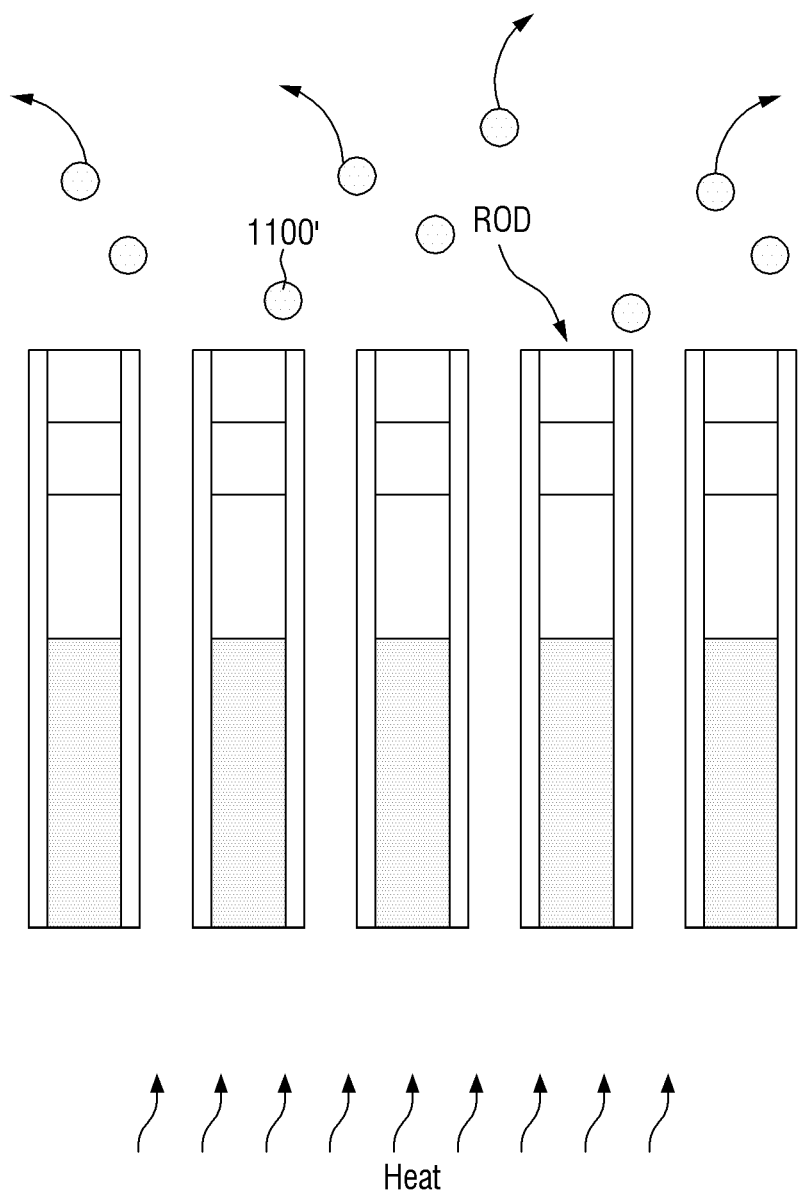

FIGS. 16 through 18 are schematic views illustrating how to separate semiconductor rods from the rod structure according to some embodiments of the present disclosure.

First, referring to FIG. 16, the auxiliary layer 1200 of the rod structure 1000 is removed. The auxiliary layer 1200 may include any one of the above-described materials and may be separated from the rod protecting layer 1100. For example, the auxiliary layer 1200 may include a TRT and may be separated by heating the rod structure 1000 to a predetermined temperature, but the present disclosure is not limited thereto.

Thereafter, referring to FIG. 17, the rod protecting layer 1100 with the auxiliary layer 1200 removed therefrom is dissolved in a predetermined solvent. The rod protecting layer 1100 may not react with an etchant for separation for removing the separation layer 2300, but may be dissolved in a predetermined solvent such as, for example, water, acetone, or IPA. As illustrated, a rod protecting layer 1100' dissolved in the solvent may remain on the semiconductor rods "ROD", and the semiconductor rods "ROD" may be separated.

Lastly, referring to FIG. 18, the rod protecting layer 1100' dissolved in the solvent is evaporated and thereby removed. As the rod protecting layer 1100 may include an organic material, the rod protecting layer 1100' dissolved in the solvent may be removed by being evaporated at a temperature that does not damage the semiconductor rods "ROD". As a result, the semiconductor rods "ROD" can be separated from the rod structure 1000, and the separated semiconductor rods "ROD" can form the light-emitting elements 300.

Accordingly, the light-emitting elements 300 fabricated by CLO can have a smooth shape without having the material of the insulating films 380 or the electrode material layers 370 removed, and the uniformity of the end surfaces of each of the light-emitting elements 300 can be secured. Also, contact failure with the electrodes of the display device 10 and emission failure can be minimized in the light-emitting elements 300, and as a result, the emission reliability of the display device 10 can be improved.

Meanwhile, the light-emitting elements 300 obtained by the above-described method can be fabricated in a state of being dispersed in predetermined ink.

Figure 19:
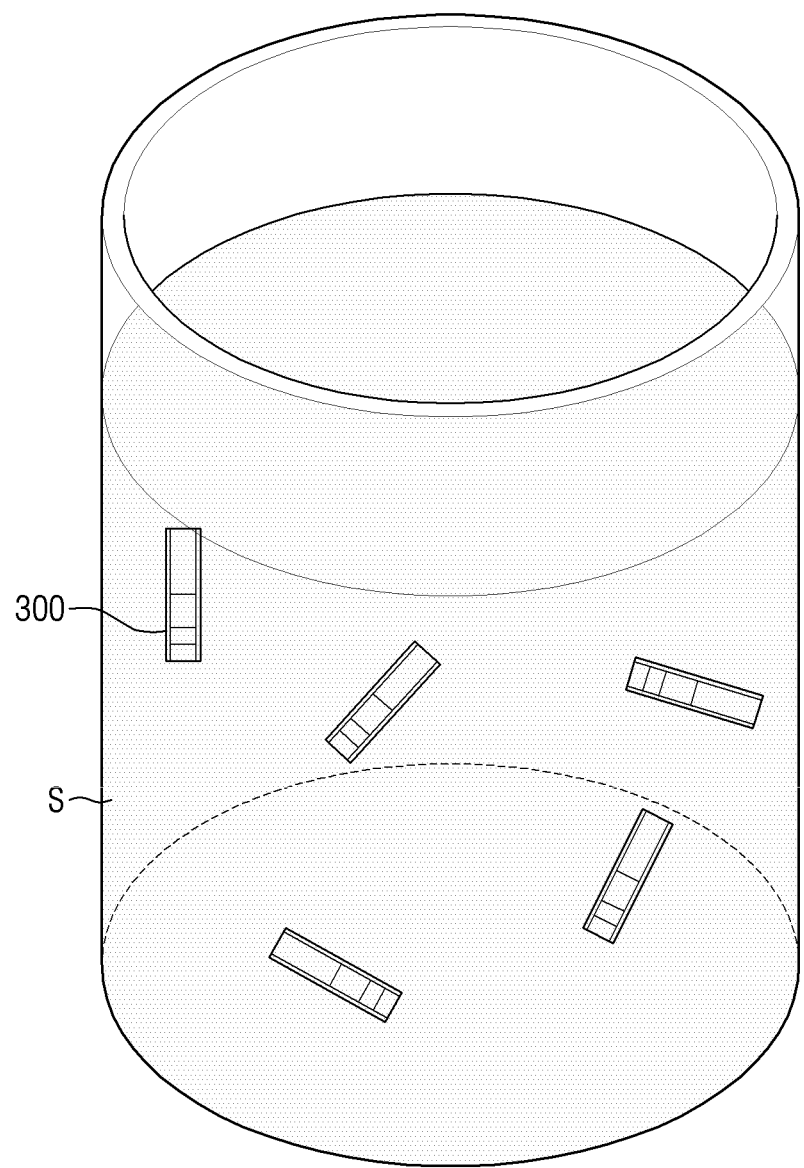
FIG. 19 is a schematic view of element ink, including light-emitting elements, according to some embodiments of the present disclosure.

FIG. 19 is a schematic view of element ink, including light-emitting elements, according to some embodiments of the present disclosure.

Referring to FIG. 19, the light-emitting elements 300 may be dispersed in the element ink S. The element ink S may not react with the light-emitting elements 300 and may include a solvent that can be evaporated during the manufacture of the display device 10. For example, the element ink S may be propylene glycol monomethyl ether (PGME), propylene glycol monomethyl ether acetate (PGMEA), propylene glycol (PG), or the like, but the present disclosure is not limited thereto.

Although not specifically illustrated, the element ink S may include a semiconductor material and may further include an element dispersant for dispersing the light-emitting elements 300 with a large specific gravity.

Accordingly, the light-emitting elements 300 can be sprayed onto the electrodes of the display device 10 in a state of being dispersed in the element ink S, during the manufacture of the display device 10. The display device 10 including the light-emitting elements 300 will hereinafter be described.

The display device 10 may include light-emitting elements 300 fabricated by the above-described method and may thus display various colors.

Figure 20:
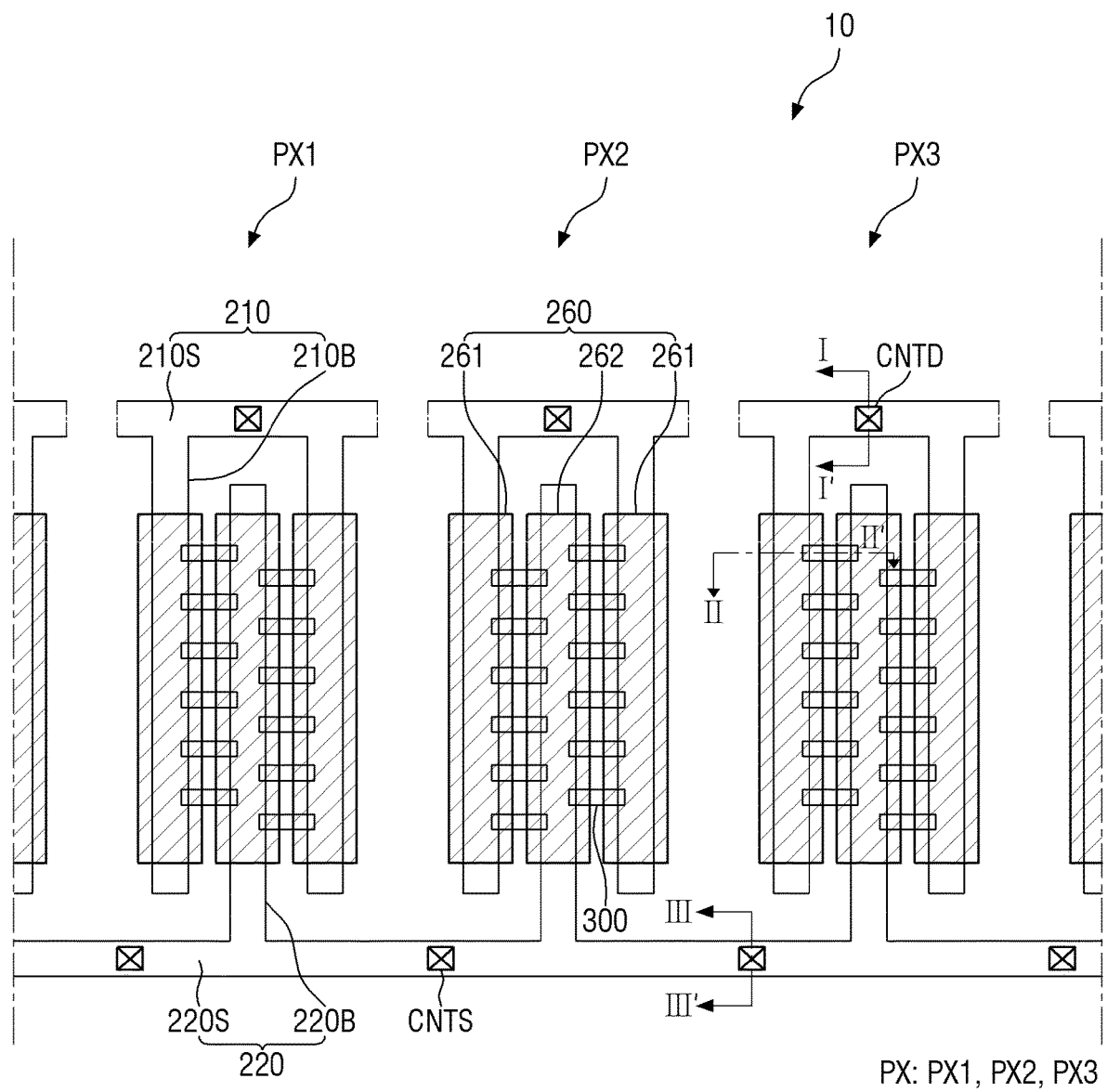
FIG. 20 is a plan view of a display device according to some embodiments of the present disclosure.

FIG. 20 is a plan view of a display device according to some embodiments of the present disclosure.

Referring to FIG. 20, the display device 10 may include one or more regions that are defined as pixels PX. Each of a plurality of pixels PX may emit light of a particular wavelength range to the outside of the display device 10. FIG. 20 illustrates three pixels (PX1, PX2, and PX3), but obviously, the display device 10 may include more than three pixels PX. FIG. 20 illustrates a plurality of pixels PX arranged only in one direction in a plan view, for example, a first direction D1, but a plurality of pixels PX may also be arranged in a second direction D2, which intersects the first direction D1.

Although not specifically illustrated, the display device 10 may include a display area and a non-display area. A plurality of pixels PX may be disposed in the display area, a plurality of electrodes (210 and 220) may be disposed in each of the pixels PX, and light-emitting elements 30 may be aligned between the electrodes (210 and 220). Accordingly, in the display area, the light-emitting elements 30 may emit light of a particular color to the outside of the display device 10.

The pixels PX may not be disposed in the non-display area, and the non-display area may be defined as an area of the display device 10 other than the display area. The non-display area may be covered by particular members so as not to be visible from outside the display device 10. Various members for driving the light-emitting elements 300 disposed in the display area may be arranged in the non-display area. For example, wires, circuits, drivers, and the like for applying electric signals to the display area may be arranged in the non-display area of the display device 10, but the present disclosure is not limited thereto.

Each of the pixels PX may include one or more light-emitting elements 300 emitting light of a particular wavelength range.

In some embodiments, pixels PX displaying different colors may include groups of light-emitting elements 300 emitting light of different colors. For example, a first pixel PX1 displaying a red color may include light-emitting elements 300 emitting red light, a second pixel PX2 displaying a green color may include light-emitting elements 300 emitting green light, and a third pixel PX3 displaying a blue color may include light-emitting elements 300 emitting blue light. However, the present disclosure is not limited to this example.

The display device 10 may include the electrodes (210 and 220) and the light-emitting elements 300. At least part of each of the electrodes (210 and 220) may be disposed in each of the pixels PX to be electrically connected to the light-emitting elements 300, and may apply electric signals to the light-emitting elements 300 so as for the light-emitting elements 300 to emit light of a particular color.

Also, at least part of each of the electrodes (210 and 220) may be used to form an electric field in each of the pixels PX to align the light-emitting elements 300. For example, the light-emitting elements 300 need to be precisely aligned between the electrodes (210 and 220), in each of the pixels PX. For example, in the case of aligning the light-emitting elements 300 via dielectrophoresis, a solution containing the light-emitting elements 300 may be sprayed onto the display device 10, and capacitance caused by an electric field may be formed by applying alternating-current power to the solution, thereby applying a dielectrophoretic force to the light-emitting elements 300 to align the light-emitting elements 300.

The electrodes (210 and 220) may include first and second electrodes 210 and 220. For example, the first electrode 210 may be a pixel electrode separated between the pixels PX, and the second electrode 220 may be a common electrode connected in common along the pixels PX. One of the first and second electrodes 210 and 220 may be an anode electrode of each of the light-emitting elements 300, and the other electrode may be a cathode electrode of each of the light-emitting elements 300. However, the present disclosure is not limited thereto.

The first and second electrodes 210 and 220 may include electrode stems (210S and 220S), which extend in the first direction D1, and one or more electrode branches (210B and 220B, which extend in a second direction D2 intersecting the first direction D1 and branch off of the electrode stems (210S and 220S)).

For example, the first electrode 210 may include a first electrode stem 210S, which extends in the first direction D1, and one or more first electrode branches 210B, which branch off of the first electrode stem 210S and extend in the second direction D2. Although not specifically illustrated, one end portion of the first electrode stem 210S may be connected to a signal applying pad, and the other end portion of the first electrode stem 210S may extend in the first direction D1 to be electrically disconnected between the pixels PX. The signal applying pad may be connected to the display device 10 or an external power source to apply electric signals to the first electrode stem 210S or to apply an alignment signal during the alignment of the light-emitting elements 300.

Both end portions of a first electrode stem 210S of an arbitrary pixel may be spaced apart and terminated between pixels PX. The first electrode stem 210S may fall on substantially the same extension line as first electrode stems 210S of neighboring pixels belonging to the same row as the arbitrary pixel (e.g., adjacent to the arbitrary pixel in the first direction D1). Accordingly, first electrode stems 210S of the pixels PX may apply different electric signals to their respective groups of electrode branches 210B, and first electrode branches 210B of each of the pixels PX may be separately driven.

The first electrode branches 210B may branch off of at least part of the first electrode stem 210S, may extend in the second direction D2, and may be terminated at a distance from a second electrode stem 220S, which is disposed to face the first electrode stem 210S. That is, first end portions of the first electrode branches 210B may be connected to the first electrode stem 210S, and second end portions of the first electrode branches 210B may be disposed in each of the pixels PX to be spaced apart from the second electrode stem 220S.

One or more first electrode branches 210B may be disposed in each of the pixels PX. FIG. 20 illustrates that two first electrode branches 210B are disposed with the second electrode branch 220B disposed therebetween, but the present disclosure is not limited thereto. That is, more than two first electrode branches 210B may be disposed.

The second electrode 220 may include the second electrode stem 220S, which extends in the first direction D1 and is disposed to be spaced apart from, and face, the first electrode stem 210S, and at least one second electrode branch 220B, which extends in the second direction D2 and is disposed to be spaced apart from, and face, the first electrode branches 210B. The first end portion of the second electrode stem 220S, like the first end portion of the first electrode stem 210S, may be connected to a signal applying pad (not illustrated). However, a second end portion of the second electrode stem 220S may extend into neighboring pixels PX in the first direction D1. That is, the second electrode stem 220S may be electrically connected between the pixels PX. Accordingly, both end portions of a second electrode stem 220S of an arbitrary pixel may be connected to end portions of second electrode stems 220S of neighboring pixels, between the pixels PX, to apply the same electric signals to each of the pixels PX.

The second electrode branch 220B may branch off of at least part of the second electrode stem 220S, may extend in the second direction D2, and may be terminated at a distance from the first electrode stem 210S. That is, a first end portion of the second electrode branch 220B may be connected to the second electrode stem 220S, and a second end portion of the second electrode branch 220B may be disposed in each of the pixels PX at a distance from the first electrode stem 210S.

Also, the second electrode branch 220B may be disposed to be spaced apart from, and face, the first electrode branches 210B. Here, as the first electrode stem 210S and the second electrode stem 220S are spaced apart from, and opposite to, each other with respect to the center of each of the pixels PX, the first electrode branches 210B and the second electrode branch 220B may extend in opposite directions. In other words, the first end portions of the first electrode branches 210B and the first end portion of the second electrode branch 220B may be disposed in opposite directions with respect to the center of each of the pixels PX, but the present disclosure is not limited thereto.

A plurality of light-emitting elements 300 may be aligned between the first electrode branches 210B and the second electrode branch 220B. For example, first end portions of at least some of the light-emitting elements 300 may be electrically connected to the first electrode branches 210B, and second end portions of at least some of the light-emitting elements 300 may be electrically connected to the second electrode branch 220B.

The light-emitting elements 300 may be spaced apart from one another in the second direction D2 and may be aligned substantially in parallel to one another. The distance between the light-emitting elements 300 is not particularly limited. Some of the light-emitting elements 300 may be arranged adjacent to one another to form a group, and other light-emitting elements 300 may be arranged at intervals of a predetermined distance to form a group or may be distributed with a non-uniform density and aligned in one direction.

Although not specifically illustrated in FIG. 20, a first insulating material layer 510 (of FIG. 21) may be disposed to cover the first electrode branches 210B, the second electrode branch 220B, and the gaps between the first electrode branches 210B and the second electrode branch 220B. The first insulating material layer 510 may protect the electrodes (210 and 220) and may insulate the electrodes (210 and 220) to be not in direct contact with each other. The light-emitting elements 300 may be aligned on the first insulating material layer 510 between the first electrode branches 210B and the second electrode branch 220B.

Contact electrodes 260 may be disposed on the first electrode branches 210B and the second electrode branch 220B. The contact electrodes 260 may be disposed on the first insulating material layer 510, which is not illustrated in FIG. 20. That is, the contact electrodes 260 may be disposed on the first insulating material layer 510 to overlap with the first electrode branches 210B and the second electrode branch 220B.

A plurality of contact electrodes 260 may extend in the second direction D2 and may be disposed to be spaced apart from one another in the first direction D1. The contact electrodes 260 may be in contact with at least one end portion of each of the light-emitting elements 300 and may also be in contact with the first or second electrode 210 or 220 to receive electric signals. Accordingly, the contact electrodes 260 may transmit electric signals received from the first and second electrodes 210 and 220 to the light-emitting elements 300.

The contact electrodes 260 may be disposed on the electrode branches (210B and 220B) to partially cover the electrode branches (210B and 220B) and may include first contact electrodes 261, which are in contact with the first end portions of the light-emitting elements 300, and a second contact electrode 262, which is in contact with the second end portions of the light-emitting elements 300.

The first contact electrodes 261 may be disposed on the first electrode branches 210B and may be in contact with the first end portions of the light-emitting elements 300 that are electrically connected to the first electrode 210. The second contact electrode 262 may be disposed on the second electrode branch 220B and may be in contact with the second end portions of the light-emitting elements 300 that are electrically connected to the second electrode 220.

In some embodiments, both end portions of each of the light-emitting elements 300 that are electrically connected to the first electrode branches 210B or the second electrode branch 220B may be conductive semiconductor layers doped with an n- or p-type dopant. In a case where the first end portions of the light-emitting elements 300 that are electrically connected to the first electrode branches 210B are conductive semiconductor layers doped with a p-type dopant, the second end portions of the light-emitting elements 300 that are electrically connected to the second electrode branch 220B may be conductive semiconductor layers doped with an n-type dopant, but the present disclosure is not limited thereto. Alternatively, in a case where the first end portions of the light-emitting elements 300 that are electrically connected to the first electrode branches 210B are conductive semiconductor layers doped with an n-type dopant, the second end portions of the light-emitting elements 300 that are electrically connected to the second electrode branch 220B may be conductive semiconductor layers doped with a p-type dopant.

Meanwhile, as illustrated in FIG. 20, the first and second electrode stems 210S and 220S may be electrically connected to a thin-film transistor 120 and a power supply line 161, respectively, that will be described later, via contact holes, for example, first and second electrode contact holes CNTD and CNTS, respectively. FIG. 20 illustrates that the contact holes on the first and second electrode stems 210S and 220S are disposed in each of the pixels PX, but the present disclosure is not limited thereto.

Although not specifically illustrated in FIG. 20, the display device 10 may further include a second insulating material layer 520 (of FIG. 21), a third insulating material layer 530 (of FIG. 21), and a passivation layer 550 (of FIG. 21), which are disposed to at least partially cover the electrodes (210 and 220) and the light-emitting elements 300. The arrangement and the structures of the second insulating material layer 520, the third insulating material layer 530, and the passivation layer 550 will be described later with reference to FIG. 21.

Figure 21:
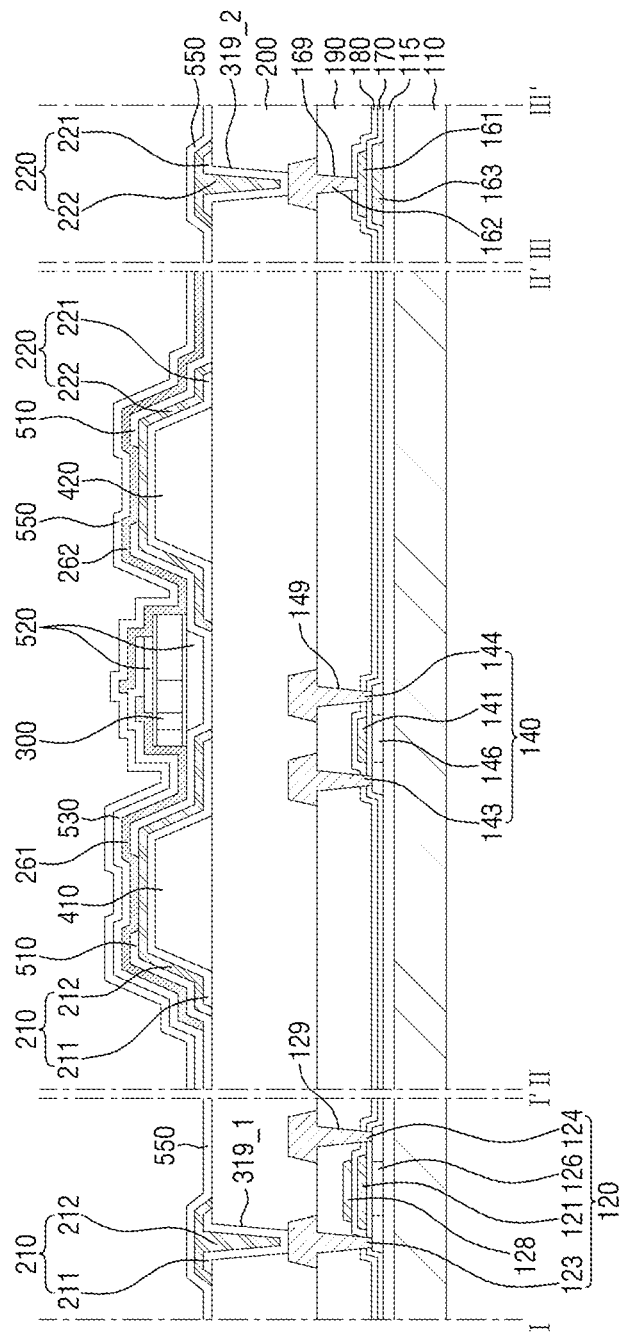
FIG. 21 is a cross-sectional view taken along lines I-I', II-II' and III-III' of FIG. 20.

FIG. 21 is a cross-sectional view taken along lines I-I', II-II', and III-III' of FIG. 20. FIG. 21 illustrates only one pixel PX, but the following description may also be directly applicable to other pixels. FIG. 21 illustrates a cross-sectional view taken along from one end to the other end of an arbitrary light-emitting element 300.

Referring to FIGS. 20 and 21, the display device 10 may include a substrate 110, thin-film transistors (120 and 140), which are disposed on the substrate 110, and electrodes (210 and 220) and light-emitting elements 300, which are disposed above the thin-film transistors (120 and 140). The thin-film transistors may include first and second thin-film transistors 120 and 140, which may be driving and switching transistors, respectively.

For example, the substrate 110 may be an insulating substrate. The substrate 110 may be formed of an insulating material such as glass, quartz, or a polymer resin. Also, the substrate 110 may be a rigid substrate or a flexible substrate that is bendable, foldable, or rollable.

A buffer layer 115 may be disposed on the substrate 110. The buffer layer 115 may prevent the diffusion of impurity ions and the penetration of moisture or the air and may perform a surface planarization function.

A semiconductor layer is disposed on the buffer layer 115. The semiconductor layer may include a first active layer 126 of the first thin-film transistor 120, a second active layer 146 of the second thin-film transistor 140, and an auxiliary layer 163. The semiconductor layer may include polycrystalline silicon, monocrystalline silicon, or an oxide semiconductor.

A first gate insulating layer 170 is disposed on the semiconductor layer. The first gate insulating layer 170 covers the semiconductor layer. The first gate insulating layer 170 may function as a gate insulating film of each thin-film transistor.

A first conductive layer is disposed on the first gate insulating layer 170. The first conductive layer may include a first gate electrode 121, which is disposed on the first active layer 126 of the first thin-film transistor 120 with the first gate insulating layer 170 interposed therebetween, a second gate electrode 141, which is disposed on the second active layer 146 with the first gate insulating layer 170 interposed therebetween, and the power supply line 161, which is disposed on the auxiliary layer 163.

A second gate insulating layer 180 is disposed on the first conductive layer. The second gate insulating layer 180 may be an interlayer insulating film.

A second conductive layer is disposed on the second gate insulating layer 180. The second conductive layer includes a capacitor electrode 128, which is disposed on the first gate electrode 121 with the second gate insulating layer 180 interposed therebetween. The capacitor electrode 128 may form a storage capacitor with the first gate electrode 121. The second conductive layer may include the same type of material as the first conductive layer.

An interlayer insulating layer 190 is disposed on the second conductive layer. The interlayer insulating layer 190 may be an interlayer insulating film. The interlayer insulating layer 190 may perform a surface planarization function. The interlayer insulating layer 190 may include an organic insulating material.

A third conductive layer is disposed on the interlayer insulating layer 190. The third conductive layer includes a first drain electrode 123 and a first source electrode 124 of the first thin-film transistor 120, a second drain electrode 143 and a second source electrode 144 of the second thin-film transistor 140, and a power supply electrode 162, which is disposed on the power supply line 161.

The first source electrode 124 and the first drain electrode 123 may be electrically connected to the first active layer 126 via first contact holes 129, which penetrate the interlayer insulating layer 190 and the second gate insulating layer 180. The second source electrode 144 and the second drain electrode 143 may be electrically connected to the second active layer 146 via second contact holes 149, which penetrate the interlayer insulating layer 190 and the second gate insulating layer 180. The power supply electrode 162 may be electrically connected to the power supply line 161 via a third contact hole 169, which penetrates the interlayer insulating layer 190 and the second gate insulating layer 180.

A via layer 200 is disposed on the third conductive layer. The via layer 200 may be formed of an organic material. The surface of the via layer 200 may be flat.

A plurality of banks (410 and 420) may be disposed on the via layer 200. The banks (410 and 420) may be disposed in each of the pixels PX to be spaced apart from, and face, each other, and first and second electrodes 210 and 220 may be disposed on the banks (410 and 420), for example, on first and second banks 410 and 420. However, the number of banks (410 and 420) is not particularly limited. Alternatively, more than banks (410 and 420) than there are in the example of FIG. 20 may be provided in each of the pixels PX, and more first electrodes 210 and more second electrodes 220 than there are in the example of FIG. 20 may be provided accordingly.

FIG. 20 illustrates that three banks (410 and 420), for example, two first banks 410 and one second bank 420, are disposed in one pixel PX, and that the first and second electrodes 210 and 220 are disposed to cover the three banks (410 and 420). FIG. 21 illustrates the cross sections of one first bank 410 and one second bank 420, and the arrangement of the first and second banks 410 and 420 of FIG. 21 may also be directly applicable to the other first bank 410 not illustrated in FIG. 21.

Meanwhile, although not specifically illustrated, the first and second electrodes 210 and 220 may include the electrode stems (210S and 220S) and the electrode branches (210B and 220B). It may be understood that, a first electrode branch 210B is disposed on the first bank 410 of FIG. 21, and a second electrode branch 220B is disposed on the second bank 420 of FIG. 21.

The banks (410 and 420) may be formed of substantially the same material by a single process. In this case, the banks (410 and 420) may form a single lattice-type pattern. The banks (410 and 420) may include polyimide (PI).

At least parts of the banks (410 and 420) may protrude with respect to the via layer 200. The banks (410 and 420) may protrude upwardly with respect to a plane where the light-emitting elements 300 are disposed, and the protruding parts of the banks (410 and 420) may be at least in part inclined. Reflective layers (211 and 221), which are disposed on the banks (410 and 420) that protrude at an inclination, may reflect incident light. Light traveling from the light-emitting elements 300 toward the reflective layers (211 and 221) may be reflected to be delivered to the outside of the display device 10, for example, to above the banks (410 and 420). The shape of the banks (410 and 420) having a protruding structure is not particularly limited. Each of the banks (410 and 420) is illustrated as having inclined side surfaces and a flat top surface with angled corners, but the present disclosure is not limited thereto. Alternatively, the banks (410 and 420) may have a curved protruding structure.

The reflective layers (211 and 221) may be disposed on the banks (410 and 420).

A first reflective layer 211 may cover the first bank 410, and part of the first reflective layer 211 may be electrically connected to the first drain electrode 123 of the first thin-film transistor 120 via a fourth contact hole 319_1, which penetrates the via layer 200. A second reflective layer 221 may cover the second bank 420, and part of the second reflective layer 221 may be electrically connected to the power supply electrode 162 via a fifth contact hole 319_2, which penetrates the via layer 200.

The first reflective layer 211 may be electrically connected to the first drain electrode 123 of the first thin-film transistor 120 via the fourth contact hole 319_1, in a pixel PX. Thus, the first thin-film transistor 120 may be disposed in an area that overlaps with each of the pixels PX. FIG. 20 illustrates that the first thin-film transistor 120 is electrically connected via a first electrode contact hole CNTD, which is disposed on a first electrode stem 210S. That is, the first electrode contact hole CNTD may be the fourth contact hole 319_1.

The second reflective layer 221 may be electrically connected to the power supply electrode 162 via the fifth contact hole 319_2, in a pixel PX. FIG. 21 illustrates that the second reflective layer 221 is connected via the fifth contact hole 319_2, in one pixel PX. FIG. 20 illustrates that the second electrode 220 of each of the pixels PX is electrically connected to the power supply line 161 via a plurality of second electrode contact holes CNTS, which are disposed on a second electrode stem 220S. That is, the second electrode contact holes CNTS may be the fifth contact hole 319_2.

As already mentioned above, FIG. 20 illustrates that first electrode contact holes CNTD are disposed on first electrode stems 210S and second electrode contact holes CNTS are disposed on a second electrode stem 220S. Accordingly, FIG. 21, which is a cross-sectional view of the display device 10, illustrates that the first and second electrodes 210 and 220 are electrically connected to the first thin-film transistor 120 and the power supply line 161, respectively, via the fourth and fifth contact holes 319_1 and 319_2, respectively, in regions that are spaced apart from the banks (410 and 420) where the first and second electrode branches 210B and 220B are disposed, but the present disclosure is not limited thereto.

Meanwhile, the reflective layers (211 and 221) may include a material with high reflectance to reflect light emitted by the light-emitting elements 300. For example, the reflective layers (211 and 221) may include a material such as silver (Ag), copper (Cu), or the like, but the present disclosure is not limited thereto.

First and second electrode layers 212 and 222 may be disposed on the first and second reflective layers 211 and 221, respectively.

The first electrode layer 212 is disposed directly on the first reflective layer 211. The first electrode layer 212 may have substantially the same pattern as the first reflective layer 211. The second electrode layer 222 is disposed directly on the second reflective layer 221 to be spaced apart from the first electrode layer 212. The second electrode layer 222 may have substantially the same pattern as the second reflective layer 221.

Electrode layers (212 and 222) may include a transparent conductive material. For example, the electrode layers (212 and 222) may include a material such as ITO, IZO, or ITZO, but the present disclosure is not limited thereto. In some embodiments, the reflective layers (211 and 221) and the electrode layers (212 and 222) may form a structure in which more than one transparent conductive layer of ITO, IZO, or ITZO and more than one metal layer of Ag or Cu are stacked. For example, the reflective layers (211 and 221) and the electrode layers (212 and 222) may form a stack structure of ITO/Ag/ITO.

The first reflective layer 211 and the first electrode layer 212, which are disposed on the first bank 410, may form the first electrode 210, and the second reflective layer 221 and the second electrode layer 222, which are disposed on the second bank 420, may form the second electrode 220. The first and second electrode layers 212 and 222 may transmit electric signals transmitted to the first and second reflective layers 211 and 221, which are connected to the first thin-film transistor 120 and the power supply electrode 162, respectively, to contact electrodes (261 and 262) that will be described later. The electric signals may be transmitted to the light-emitting elements 300, and as a predetermined current flows into the light-emitting elements 300, the light-emitting elements 300 may emit light.

A first insulating material layer 510 is disposed on the first and second electrodes 210 and 220 to cover parts of the first and second electrodes 210 and 220. The first insulating material layer 510 may be disposed to cover most of the top surfaces of the first and second electrodes 210 and 220, but may expose parts of the first and second electrodes 210 and 220. Also, the first insulating material layer 510 may be disposed even in the space between the first and second electrodes 210 and 220. The first insulating material layer 510 may be formed in an island or linear shape along the space between the first and second electrode branches 210B and 220B, in a plan view.

Also, the first insulating material layer 510 may be disposed to cover parts of non-opposing side surfaces of the first and second electrodes 210 and 220. The first insulating material layer 510 may overlap with parts of the electrodes (210 and 220), for example, parts of the first and second electrodes 210 and 220 that protrude in the direction where the first and second electrodes 210 and 220 face each other. Also, the first insulating material layer 510 may be disposed in regions of each of the electrodes (210 and 220) that overlap with the inclined side surfaces and the flat top surface of each of the banks (410 and 420).

The light-emitting elements 300 are disposed on the first insulating material layer 510. The first insulating material layer 510 may be in contact with the electrodes (210 and 220) and may insulate the electrodes (210 and 220) from each other. Accordingly, the first insulating material layer 510 may protect the regions that overlap with the electrodes (210 and 220) and may electrically insulate the regions that overlap with the electrodes (210 and 220). Also, the first insulating material layer 510 may prevent first and second conductivity semiconductors 310 and 320 of each of the light-emitting elements 300 from being in direct contact with other members and may thereby prevent damage to the light-emitting elements 300.

However, the present disclosure is not limited to this. Alternatively, in some embodiments, the first insulating material layer 510 may be disposed only in regions that overlap with the inclined side surfaces of each of the banks (410 and 420) on the first and second electrodes 210 and 220. In this case, the bottom surface of the first insulating material layer 510 may be terminated on the inclined side surfaces of each of the banks (410 and 420), and the electrodes (210 and 220), which are disposed on parts of the inclined side surfaces of each of the banks (410 and 420), may be exposed and placed in contact with contact electrodes 260.

Also, the first insulating material layer 510 may be disposed to expose both end portions of each of the light-emitting elements 300. Accordingly, the contact electrodes 260 may be in contact with the exposed top surfaces of the electrodes (210 and 220) and both end portions of each of the light-emitting elements 300 and may transmit electric signals applied to the first and second electrodes 210 and 220 to the light-emitting elements 300.

One or more light-emitting elements 300 may be disposed between the first and second electrodes 210 and 220. FIG. 21 illustrates that in a cross-sectional view, one light-emitting element 300 is disposed between the first and second electrodes 210 and 220, but as illustrated in FIG. 20, multiple light-emitting elements 300 may be arranged in another direction (e.g., in the second direction D2) in a plan view.

For example, first end portions of the light-emitting elements 300 may be electrically connected to the first electrode 210, and second end portions of the light-emitting elements 300 may be electrically connected to the second electrode 220. Both end portions of each of the light-emitting elements 300 may be in contact with first and second contact electrodes 261 and 262.

For example, the light-emitting elements 300 may be semiconductor nano-rods having first end portions doped with impurities of a first conductivity type and second end portions doped with impurities of the second conductivity type, which have a different polarity from the impurities of the first conductivity type. Each of the light-emitting elements 300 may include a first conductivity semiconductor 310, an element active layer 330, a second conductivity semiconductor 320, and an electrode material layer 370, which are sequentially formed, and an insulating film 380, which surrounds the outer circumferential surfaces of the first conductivity semiconductor 310, the element active layer 330, the second conductivity semiconductor 320, and the electrode material layer 370.

In each of the light-emitting elements 300, the first conductivity semiconductor 310, the element active layer 330, the second conductivity semiconductor 320, and the electrode material layer 370 may be arranged in a direction parallel to the via layer 200. In other words, the light-emitting elements 300, in which the above-described layers are formed, may be arranged in a horizontal direction parallel to the via layer 200, but the present disclosure is not limited thereto. Alternatively, the light-emitting elements 300 may be aligned between the first and second electrodes 210 and 220 such that the above-described stack direction thereof may be reversed.

A second insulating material layer 520 may be disposed to overlap with at least some regions on the light-emitting elements 300. The second insulating material layer 520 may protect the light-emitting elements 300 and may fix the light-emitting elements 300 between the first and second electrodes 210 and 220.

FIG. 21 illustrates that, in a cross-sectional view, the second insulating material layer 520 is disposed only on the top surfaces of the light-emitting elements 300, but the second insulating material layer 520 may be disposed to surround the outer surfaces of the light-emitting elements 300. That is, in a plan view, the second insulating material layer 520, like the first insulating material layer 510, may extend in the second direction D2 along the space between the first and second electrode branches 210B and 220B to have an island or linear shape.

Also, some of the material of the second insulating material layer 520 may be disposed even in regions where the bottom surfaces of the light-emitting elements 300 and the first insulating material layer 510 adjoin. This may be formed when the light-emitting elements 300 are aligned on the first insulating material layer 510 and the second insulating material layer 520 is disposed on the light-emitting elements 300, during the manufacture of the display device 10.

The second insulating material layer 520 is disposed to such that both side surfaces of each of the light-emitting elements 300 are exposed. In this case, the contact electrodes (261 and 262) that will be described later may be in proper contact with the side surfaces of both end portions of each of the light-emitting elements 300, but the present disclosure is not limited thereto. Alternatively, the length of the second insulating material layer 520 may coincide with the length of the light-emitting elements 300 such that the second insulating material layer 520 and the light-emitting elements 300 may be aligned.

The first contact electrode 261, which is disposed on the first electrode 210 and overlaps with at least part of the second insulating material layer 520, and the second contact electrode 262, which is disposed on the second electrode 220 and overlaps with at least part of the second insulating material layer 520, may be disposed on the second insulating material layer 520.

The first and second contact electrodes 261 and 262 may be disposed on the top surfaces of the first and second electrodes 210 and 220, respectively. For example, the first and second contact electrodes 261 and 262 may be in contact with the first and second electrode layers 212 and 222, respectively, in regions where parts of the first and second electrodes 210 and 220 are exposed due to the first insulating material layer 510 being patterned. Also, the first and second contact electrodes 261 and 262 may be in contact with the side surfaces of both end portions of each of the light-emitting elements 300, for example, the first conductivity semiconductor 310, the second conductivity semiconductor 320, or the electrode material layer 370 of each of the light-emitting elements 300. Accordingly, the first and second contact electrodes 261 and 262 may transmit electric signals applied to the first and second electrode layers 212 and 222 to the light-emitting elements 300.

The first and second contact electrodes 261 and 262 may be disposed on the second or third insulating material layer 520 or 530 to be spaced apart from each other. As a result, the first and second contact electrodes 261 and 262 may receive different powers from the first thin-film transistor 120 and the power supply line 161, respectively.

The contact electrodes (261 and 262) may include a conductive material. For example, the contact electrodes (261 and 262) may include ITO, IZO, ITZO, or Al, but the present disclosure is not limited thereto.

The third insulating material layer 530 may be disposed on the first contact electrode 261 to electrically insulate the first and second contact electrodes 261 and 262 from each other. The third insulating material layer 530 may be disposed to cover the first contact electrode 261, but not to overlap with some regions on the light-emitting elements 300 such that the light-emitting elements 300 may be in contact with the second contact electrode 262.

Meanwhile, in some embodiments, the display device 10 may not include the third insulating material layer 530. Accordingly, the first and second contact electrodes 261 and 262 may be placed on substantially the same plane, and the first and second contact electrodes 261 and 262 may be electrically insulated from each other by a passivation layer 550 that will be described later.

The passivation layer 550 may be formed on the third insulating material layer 530 and the second contact electrode 262 to protect the elements disposed on the via layer 200 from an external environment. If the first and second contact electrodes 261 and 262 are exposed, the contact electrodes may be damaged and disconnected. Thus, the first and second contact electrodes 261 and 262 may be covered by the passivation layer 550. In a case where the third insulating material layer 530 is not provided, as described above, the passivation layer 550 may be formed on the first and second contact electrodes 261 and 262.

The first insulating material layer 510, the second insulating material layer 520, the third insulating material layer 530, and the passivation layer 550 may include an inorganic insulating material. For example, the first insulating material layer 510, the second insulating material layer 520, the third insulating material layer 530, and the passivation layer 550 may include a material such as silicon oxide (SiOx), silicon nitride (SiNx), silicon oxynitride (SiOxNy), aluminum oxide (Al2O3), or aluminum nitride (AlN). The first insulating material layer 510, the second insulating material layer 520, the third insulating material layer 530, and the passivation layer 550 may be formed of the same material or different materials.

In concluding the detailed description, those skilled in the art will appreciate that many variations and modifications can be made to the embodiments without substantially departing from the principles of the present disclosure. Therefore, the disclosed embodiments of the disclosure are used in a generic and descriptive sense only and not for purposes of limitation.

What is claimed is:

1. A method of fabricating a light-emitting element, the method comprising:
   preparing a lower substrate, which includes a substrate and a separation layer on the substrate;
   preparing at least one semiconductor rod on the separation layer;
   forming a rod structure, which includes a rod protecting layer on the separation layer to surround the at least one semiconductor rod;
   forming an auxiliary layer on at least part of the rod protecting layer;
   separating the rod structure from the lower substrate by removing the separation layer; and
   separating the at least one semiconductor rod from the rod structure.

2. The method of claim 1, wherein, in the separating the rod structure, the separation layer is etched away by an etchant for separation, and
   wherein the rod protecting layer does not react with the etchant for separation.

3. The method of claim 2, wherein the etchant for separation includes a material containing fluorine (F), and
   wherein the rod protecting layer includes an organic material that is insoluble in the etchant for separation.

4. The method of claim 3, wherein the forming the rod structure comprises forming the rod protecting layer by coating the at least one semiconductor rod with the organic material.

5. The method of claim 4, wherein the organic material of the rod protecting layer includes at least one of polymethyl methacrylate (PMMA), photoresist (PR), and poly-(3,4-ethylenedioxy thiophene)polystyrene sulfonate (PEDOT:PSS).

6. The method of claim 4, wherein the separating the at least one semiconductor rod comprises removing the auxiliary layer from the rod protecting layer, dissolving the organic material of the rod protecting layer in a solvent, and removing the organic material dissolved in the solvent.

7. The method of claim 6, wherein the removing the organic material dissolved in the solvent comprises thermally treating, and thereby evaporating, the organic material.

8. The method of claim 1, wherein, in the preparing the at least one semiconductor rod, uneven patterns, including one or more grooves, which are parts of the separation layer that are depressed, and protrusions, which are formed due to the grooves being spaced apart from one another, are formed.

9. The method of claim 8, wherein the forming the rod structure comprises forming the rod protecting layer to surround the protrusions of the separation layer and to be in contact with top surfaces of the grooves.

10. The method of claim 9, wherein the at least one semiconductor rod is arranged in the rod protecting layer such that a first end portion of the at least one semiconductor rod faces a first surface of the rod protecting layer and a second end portion of the at least one semiconductor rod that is opposite to the first end portion of the at least one semiconductor rod faces a second surface of the rod protecting layer that is opposite to the first surface of the rod protecting layer.

11. The method of claim 10, wherein the second end portion of the at least one semiconductor rod is in contact with the protrusions of the separation layer.

12. The method of claim 11, wherein the at least one semiconductor rod is arranged in a direction perpendicular to the first surface of the rod protecting layer.

13. The method of claim 12, wherein the at least one semiconductor rod includes a semiconductor crystal, which includes a first conductivity semiconductor, an active layer, and a second conductivity semiconductor having a different polarity from the first conductivity semiconductor, and an insulating film, which surrounds an outer circumferential surface of the semiconductor crystal.

14. The method of claim 11, wherein the auxiliary layer is formed on the first surface faced by the first end portion of the at least one semiconductor rod.

15. A light-emitting element structure comprising:
   an organic protective film including an organic material that is insoluble in an etchant containing fluorine (F);
   at least one semiconductor rod disposed in the organic protective film and arranged to be spaced apart in a direction parallel to a first surface of the organic protective film; and
   an auxiliary layer formed on at least part of the organic protective film,
   wherein the organic material of the organic protective film includes at least one of polymethyl methacrylate (PMMA), photoresist (PR), and poly-(3,4-ethylenedioxy thiophene)polystyrene sulfonate (PEDOT:PSS).

16. The light-emitting element structure of claim 15, wherein the first surface of the organic protective film is substantially flat, and wherein a second surface of the organic protective film that is opposite to the first surface of the organic protective film, and on which the auxiliary layer is not formed, includes at least one depression, which is formed due to an area that overlaps with the at least one semiconductor rod being depressed.

17. The light-emitting element structure of claim 16, wherein a long axis of the at least one semiconductor rod extends in a direction perpendicular to the first surface of the organic protective film.

18. The light-emitting element structure of claim 17, wherein the at least one semiconductor rod is aligned such that first and second end portions of the at least one semiconductor rod face the first and second surfaces, respectively, of the organic protective film, and wherein the second end portion of the at least one semiconductor rod is in part in contact with the at least one depression.

19. The light-emitting element structure of claim 18, wherein the at least one semiconductor rod includes a semiconductor crystal, which includes a first conductivity semiconductor, a second conductivity semiconductor having a different polarity from the first conductivity semiconductor, and an active layer disposed between the first and second conductivity semiconductors, and wherein the semiconductor crystal has a structure in which the first conductivity semiconductor, the active layer, and the second conductivity semiconductor are stacked in the direction in which the long axis of the at least one semiconductor rod extends.

\* \* \* \* \*